United States Patent [19]

Mori et al.

[11] 4,051,593

[45] Oct. 4, 1977

[54] COMPONENT MOUNTING APPARATUS

[75] Inventors: Kazuhiro Mori; Yoshihiko Misawa, both of Katano, Japan

[73] Assignee: Matsushita Electric Industrial Co., Ltd., Kadoma, Japan

[21] Appl. No.: 672,958

[22] Filed: Apr. 2, 1976

[30] Foreign Application Priority Data

| | | |
|---|---|---|
| Apr. 7, 1975 | Japan | 50-42650 |
| Apr. 7, 1975 | Japan | 50-42651 |
| Jan. 30, 1976 | Japan | 51-9858 |
| Jan. 30, 1976 | Japan | 51-9859 |
| Jan. 30, 1976 | Japan | 51-9860 |
| Jan. 30, 1976 | Japan | 51-9865 |

[51] Int. Cl.$^2$ ............................................. H05K 3/32
[52] U.S. Cl. .................................. 29/564.6; 29/714; 29/741
[58] Field of Search ....... 29/203 B, 203 DT, 203 DS, 29/203 D, 626, 33 K, 33, 564.6, 739, 741, 714

[56] References Cited

U.S. PATENT DOCUMENTS

| | | | |
|---|---|---|---|
| 3,597,824 | 8/1971 | Yoshida et al. | 29/203 B |
| 3,724,055 | 4/1973 | Holmes et al. | 29/203 B |
| 3,777,350 | 12/1973 | Maeda et al. | 29/203 B |

*Primary Examiner*—Carl E. Hall
*Attorney, Agent, or Firm*—Wenderoth, Lind & Ponack

[57] ABSTRACT

Component mounting method and apparatus in which a plurality of component substrates carrying different components are provided on a common stand movable to bring successive required component substrates to a cut-off and transfer unit which for each component cuts component leads to separate the component from the component substrate and simultaneously grips the leads, thereby supporting the components, then turns and transfers the component to a chuck means forming part of an insertion unit, the component substrate being simultaneously advanced to bring a next component into position for immediate or subsequent cut-off. The chuck means holding the component turns to bring the component leads to a required attitude then releases the component which is inserted into a printed circuit board, for example, component leads being then clinched by a separate clincher unit.

14 Claims, 41 Drawing Figures

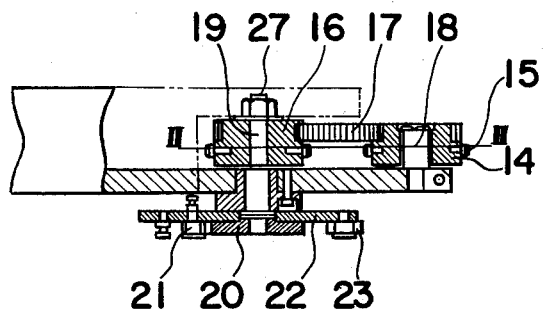
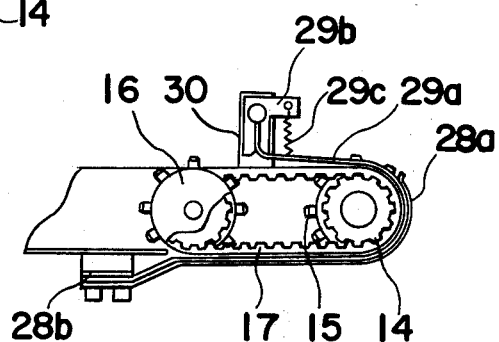
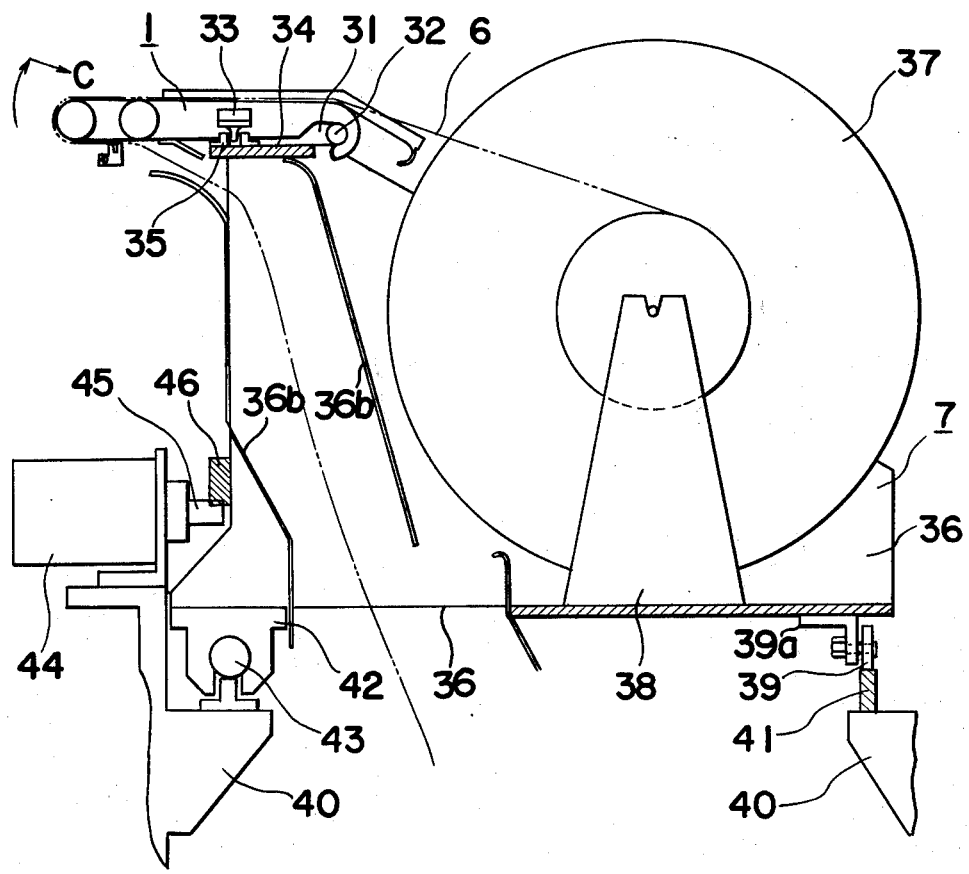

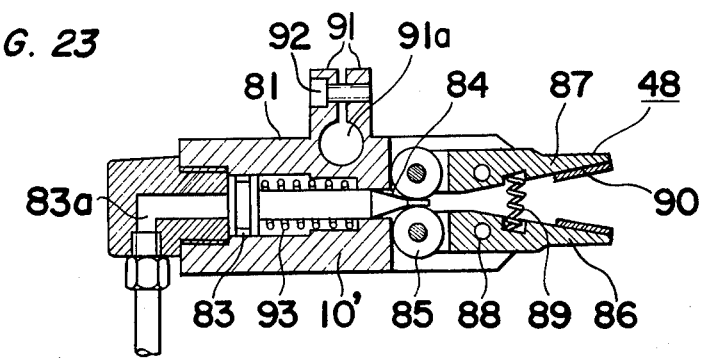
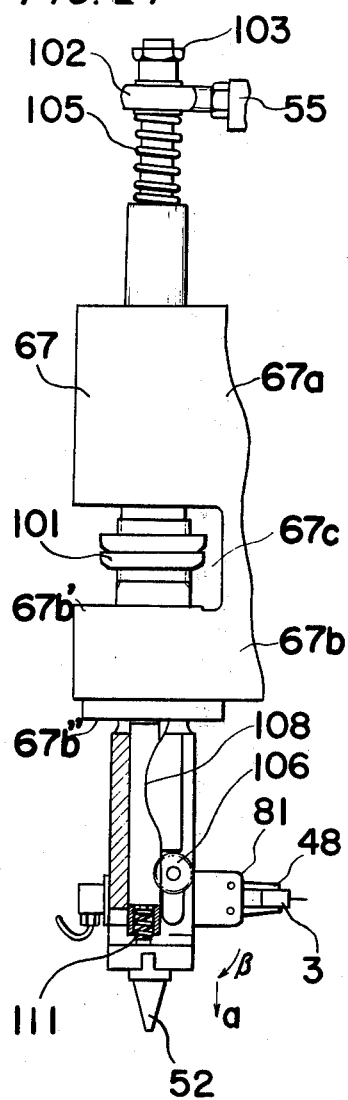
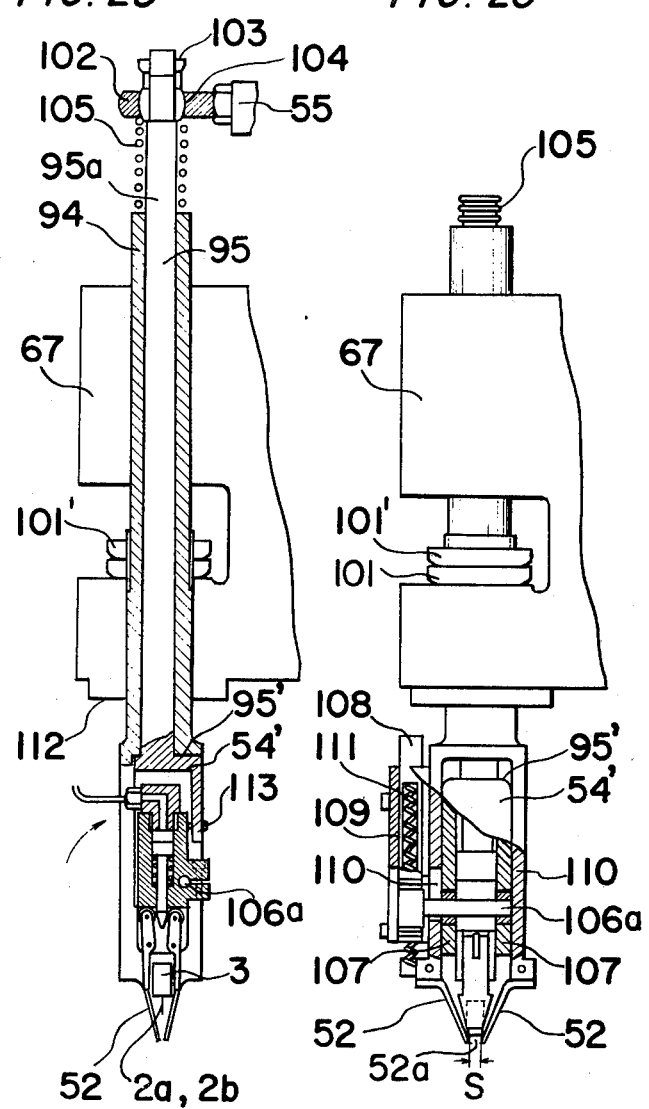

FIG. 29 (a)
FIG. 29 (b)
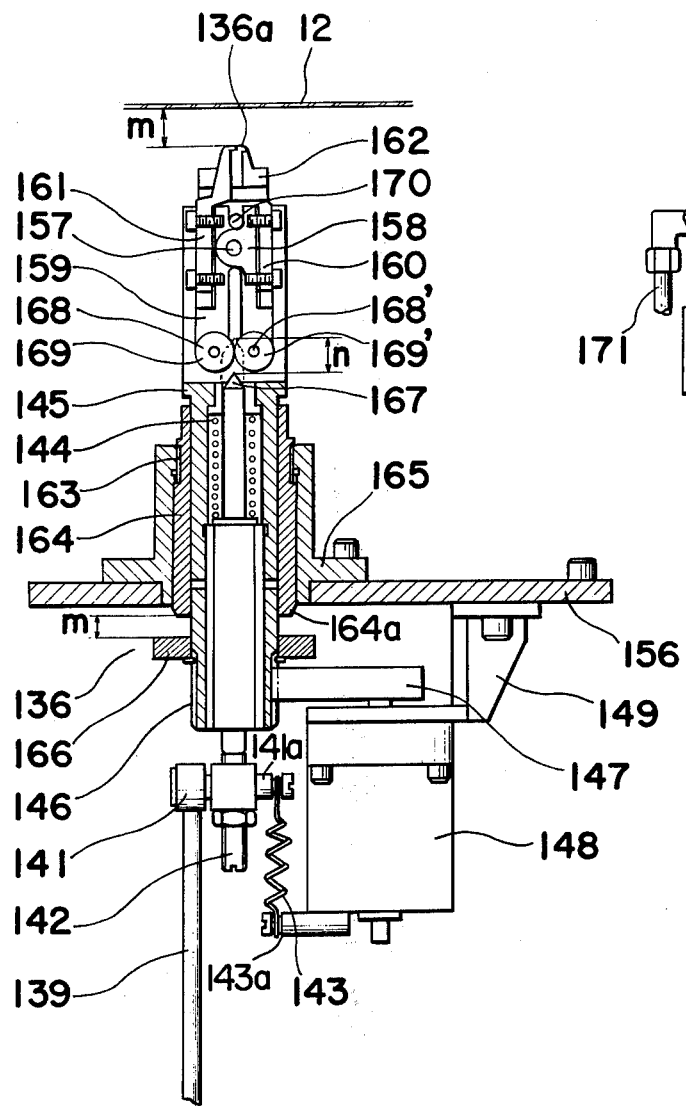
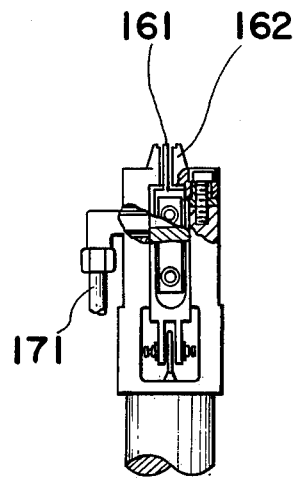

COMPONENT MOUNTING APPARATUS

The present invention relates to a component mounting method and apparatus. More particularly the invention relates to a method of mounting on a printed circuit board components having different shapes and having leads extending in the same direction.

In the electrical industry it is desirable to provide equipment for effecting automatic mounting of components, for example ceramic capacitors, electrolytic capacitors, and vertical resistors, such as shown in FIGS. 1(a), 1(b), and 1(c) respectively, at requisite locations on a printed circuit board. There are known apparatus wherein components for mounting are initially provided in a random mass in a hopper from which they are removable by suction or similar means. However, in such apparatus there is liable to be damage to components or leads thereof due to contact with other components, and it has been found difficult to ensure reliable supply of components from the hopper. It has accordingly been found advantageous to initially provide components on a component substrate constituted for example by two pliable, ribbon-like tapes between which components or leads thereof are held, and from which components may be separated as required. Conventional components mounting apparatus employing such component substrate may be classified into two main types on the basis of the component feed method. In a 1st type of apparatus, different components are initially provided on a single component substrate in the order in which they are to be mounted on a printed circuit. As shown in FIG. 2(a), with this feed method components on a substrate may be successively supplied to a set location above a printed circuit board, which is moved by suitable means not shown to bring different portions thereof into vertical line with the set location, and successive components are separated from the component substrate and the leads thereof are inserted into holes in the circuit board and subsequently clinched by suitable means not shown. This feed method has the advantage that no supplementary transport means is required, since only one component substrate bringing components directly to the printed circuit is required extra transport means is unnecessary and construction is comparatively simple. However, a particular disadvantage with this apparatus is that there is no allowance for any fault in component transport, since the order of components is unchangeable. Thus, supporting, as a simple example, that components initially supported by a component substrate are alternately capacitors and resistors, if for some reason the component substrate fails to be advanced one component-to-component interval, which may easily happen quite frequently in a mass-production process, capacitors will be subsequently mounted in printed circuit board locations for resistors, and vice versa. A matter disadvantage is that support of components having different sizes and different shapes on one and the same component substrate often presents problems with respect to maintaining overall stability of the component substrate, or if capacitors are laid down as shown in FIG. 2(b) in order to achieve a stable component substrate, there is subsequently difficulty in setting the component upright on a circuit board. Further disadvantages are that since, again for reasons of component substrate stability, component leads must be initially spread in opposite directions from the component, as shown in FIG. 2(a), there is required the extra work stage of spreading the leads in this manner, and also, when the leads are made generally parallel and inserted into a circuit board the distance between leads is greater than the diameter of a component, which means that a larger circuit is required and may possibly affect circuit characteristics.

In a second type of component mounting apparatus there is provided a plurality of component substrates, each carrying one particular kind of component. A cutter unit is associated with each component substrate and cuts off components as required, after which components are transported by common conveyor or pipe means on which there is provided an attitude control means to cause component leads to incline downwards, and are brought to an insertion unit which inserts the components on a printed circuit. A principal disadvantage with this means is that components are only loosely supported by the transport means and, since different components are transported by a common transport means from component substrates to an insertion unit, the transport means is larger than necessary for some components, which are therefore liable to turn or change attitude during transport, with the result that constant correct supply of components to circuit boards is difficult to achieve. Another disadvantage is that transport of components from substrates to the insertion unit takes time, and speed of transport is more or less fixed, with the result that is difficult to shorten time per mounting cycle, i.e., for time required for mounting requisite components on one circuit board. A further disadvantage is that although the problem of component substrate stability is resolved, there must be provided a large number of cutter units, which make equipment more complex.

It is accordingly a principal object of the invention to provide a component mounting method and apparatus permitting mounting of a variety of different components by a single unit, and ensuring stable and constant supply of components.

It is another object of the invention to provide a component mounting method wherein components are always held by suitable elements controlling component attitude thereby ensuring that component leads are always brought to correct alignment for insertion.

It is a further object of the invention to provide a component mounting method and apparatus making it possible to shorten time per mounting cycle.

It is another object of the invention to provide a component mounting apparatus having a simplified construction.

In achieving these and other objects there is provided according to the present invention a component mounting method and apparatus wherein a plurality of component substrates carrying different types of components are initially mounted on a plurality of corresponding reels and may be unwound from the reels by individual transport units. The transport units and reels are together mounted on a movable stand which is movable to bring the leading end of a required component substrate to a single cutter and transfer unit. The cutter and transfer unit removes a component from the component substrate brought to this location by cutting the leads of the component, and simultaneously with this cutting action grips the component leads, thereby supporting the component, which is now held horizontal.

When this is done, a pusher means advances the component substrate to bring a succeeding component thereon to a position for detachment from the component substrate. This pusher similarly advances other selected component substrates, and is actuated, in response to detection unit output, when there is no component at the cut-off station. Thus, if a component is missing the corresponding component substrate is always advanced, so avoiding problems of failure of components to be mounted and of components being mounted in incorrect locations.

Next the cutter and transfer unit still holding the component pivots in a horizontal plane and transfers the component to a chuck element forming part of an insertion unit, the component being released by the cutter and transfer unit once held by the chuck element. The chuck element now pivots in a vertical plane to bring the component leads into a downward alignment, the component being simultaneously lowered by the insertion unit of which the chuck element forms a part, whereby the component leads are inserted into holes in a printed circuit board brought in readiness to a requisite position below the insertion unit, after which a clinching unit below the printed circuit board moves up to clinch the component leads.

The invention offers a principal advantage that despite the fact that different types and sizes of components can be mounted there is no random movement of components at any stage, but components are always held in definite alignment, whereby components are always accurately brought to an insertion position. A further advantage is that mounting apparatus construction is considerably simplified, since only one cutter means and only one component substrate advance means are required for all types of components. Also, in the apparatus of the invention the cutter and transfer unit, insertion unit and clinching unit may all be actuated by a single drive means, whereby mounting of components may be easily speeded in a uniform manner.

A better understanding of the present invention may be had from the following full description when read in reference to the attached drawings in which like numbers refer to like parts, and FIG. 1(a) is a perspective view of a ceramic capacitor, FIG. 1(b) is a perspective view of an electrolytic capacitor and FIG. 1(c) is a perspective view of a resistor;

FIG. 7 is a cross-sectional view taken along the line I—I of FIG. 6;

FIG. 8 is a cross-sectional view taken along the line II—II of FIG. 7;

FIG. 10 is an elevation view, partly in section, showing the mode of supply of a component substrate from reel supply means to a transport unit and mounting of a movable transport unit support and selection block;

FIG. 23 is a cross-sectional view of a chuck means constituting part of the insertion unit;

FIGS. 24 through 26 are side views partly in section showing construction and illustrating action in subsequent stages of the insertion unit;

Figure 30:
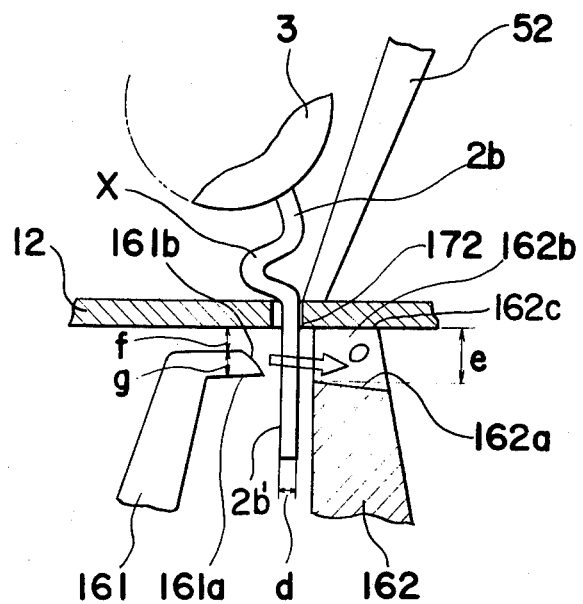
Figure 31:
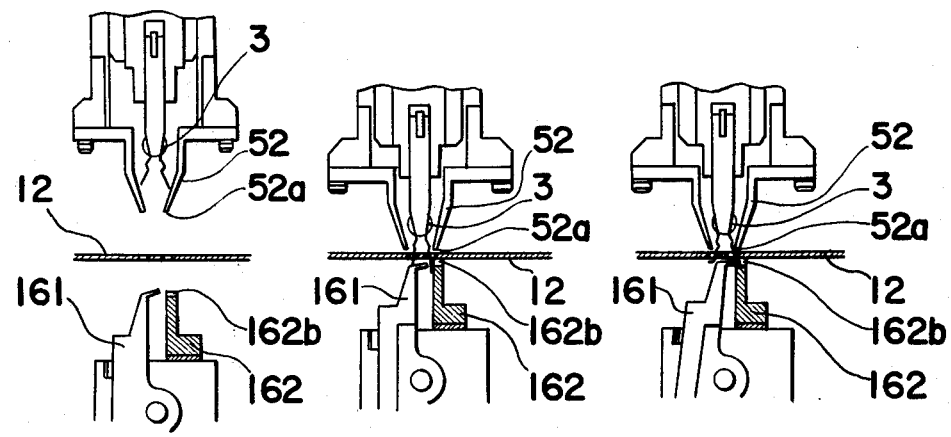
Figure 32:
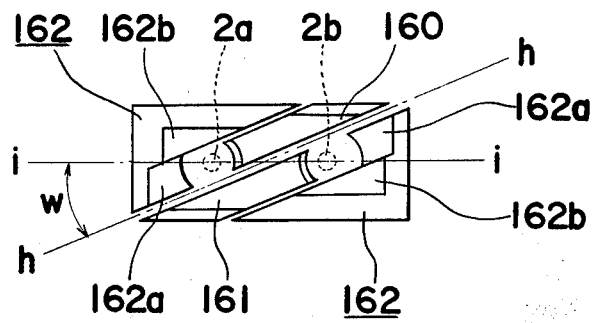
Figure 33:
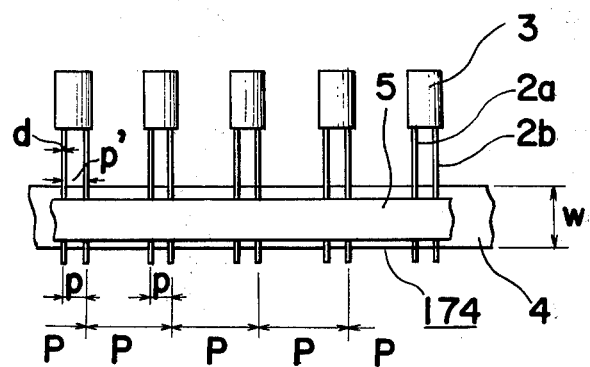
Figure 34:
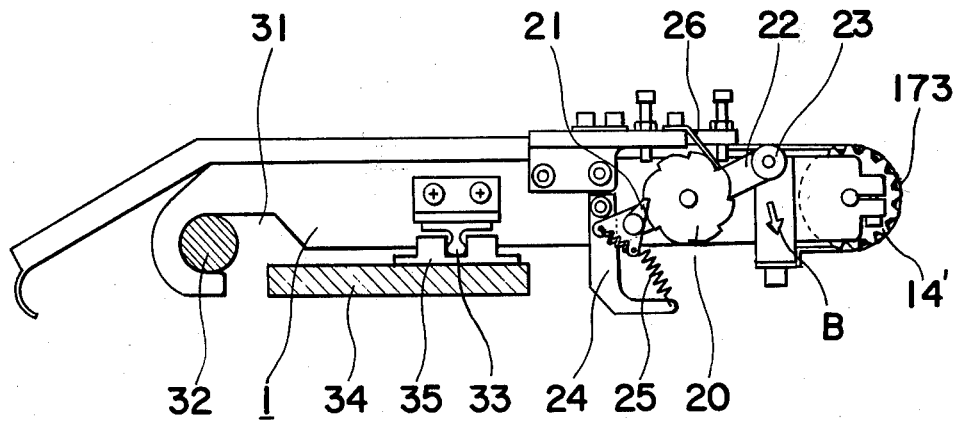

FIG, 29(a) is a sectional view of a lead wire clinching unit, and FIG. 29(b) is a view, with a portion broken away of a portion of the lead wire clinching unit;

FIG. 30 is an explanatory drawing illustrating the principles of component lead clipping and bending by the clinching unit;

FIG. 31(a) is a sectional view showing an arrangement prior to component mounting, FIG. 31(b) is a view similar to FIG. 31(a) showing the arrangement at the time of component mounting, and FIG. 31(c) is a view similar to FIG. 31(a) showing the arrangement at the time lead wires are clinced;

FIG. 32 is an enlarged, schematic plane view of a cutter blade and die portion included in the clinching units; and FIG. 33 and 34 are respectively plan and side views showing a modification of component substrate advance means according to the invention.

Figure 1:
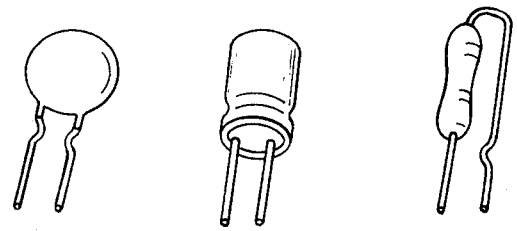
Figure 2:
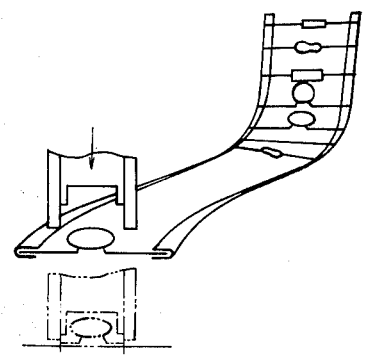
FIG. 2(a) is a schematic diagram showing a conentional method of component mounting.
FIG. 2(b) is a sectional view showing a component mounted on a circuit board by the conventional component mounting method.
Figure 2:
Figure 3:
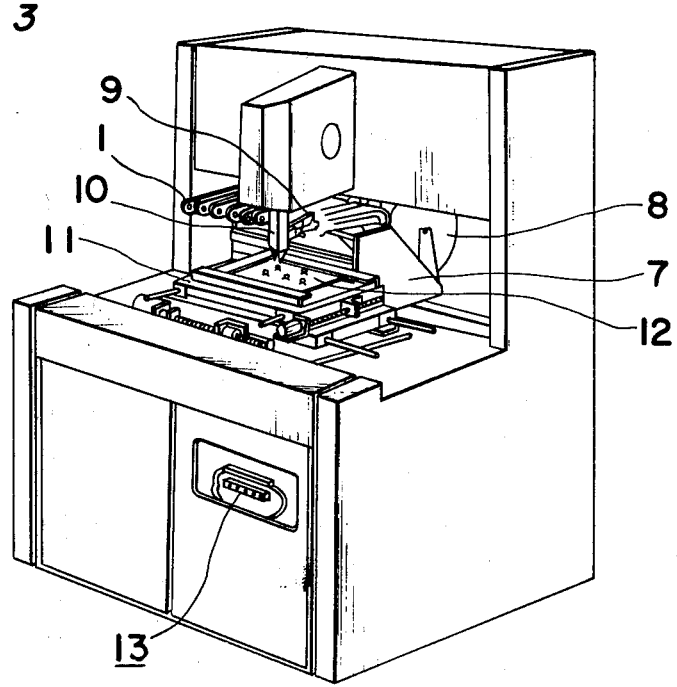
FIG. 3 is a general external view of a component mounting apparatus according to the invention.
Figure 4:
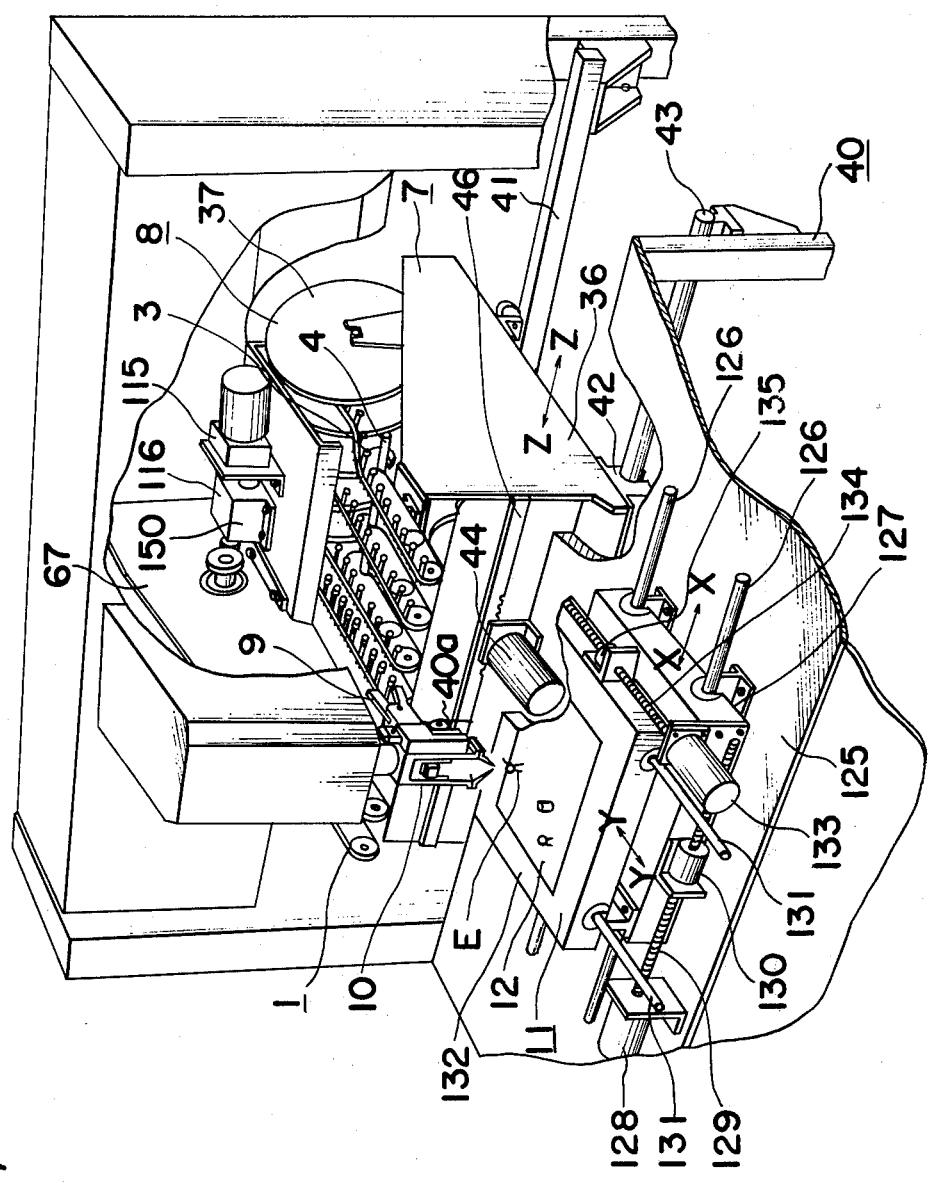
FIG. 4 is a perspective view partly in section showing details and relative disposition of main portions of the apparatus of the invention.

Referring to FIGS. 3 and 4, there is shown a component mounting apparatus according to the invention which comprises a latterally movable component selection block 7 which carries a plurality of reel units 8 which each has wound thereon a ribbon-like component substrate 6 carrying a particular type of component 3, and a corresponding number of transport units 1 which with respect to the apparatus are in front of the reel stands 8. Each transport unit 1 is actuable to unwind, in set steps in a rear to forward direction, a component substrate 6 carried by the corresponding reel stand 8. At a set generally central location of the apparatus there is provided cutter and transfer unit 9 and insertion unit 10. Different amount of left or right movement of the movable table 7 brings different transport units 1 into line with the cutter and transfer unit 9. The leading component 3 on the component substrate which is currently in line with the cutter and transfer unit 9 is separated from the component substrate by the unit 9 and transferred thereby to the insertion unit 10, which inserts the component into a printed circuit board 12 mounted on a positioning support 11 which is movable along normal X and Y axes to bring requisite portions of the circuit board 12 into line with the insertion unit 10. After insertion of the component the leads thereof are clipped to a set length and bent flat against the lower surface of the printed circuit board 12 by a clinching unit 136, not shown. In a front wall portion of the apparatus there is provided a control panel 13 comprising requisite selection and control means for actuation of the above described elements.

In FIGS. 4 and 10, the component selection block 7 comprises a flat base 36 and left and right side walls 36a, and is guided in left and right motion by bearing 42 fixedly attached to the lower surface of the front edge portion of the base 36 thereof and sliding on fixed rail 43 which is mounted on a main frame portion 40 of the apparatus, and by a roller 39 which is rotatably mounted on a bracket 39a affixed to a rear edge portion of the selection block base 36 and rolls on a rail 41 provided in left to right alignment and fixedly mounted on main frame portion 40. Drive of the component selection block 6 is effected by a pulse motor 44 mounted in a set position on main frame 40 and driving a pinion 45 which engages a rack 46 which is disposed in a left to right alignment and is defined by or fixedly mounted on a front edge portion of selection block base 36. The reel stands 8, which each carry a reel 37 rotatably mounted on vertical pairs of walls 38, are fixedly mounted on a rear portion of the base 36. Extending between, and having opposite ends fixedly attached to upper, front portions of the selection block side walls 36a ther is a horizontal support board 34 which supports the component substrate transport units 1. In line with and below each transport unit there are provided downwardly inclined guides 36b which guide those portions of component substrate 6 from which components 3 have been removed in a manner described below to an opening which is formed in the selection block base 36 and leads to a disposal bin, not shown, which is provided in the lower portion of the apparatus and permits subsequent removal of used component substrate.

Figure 5:
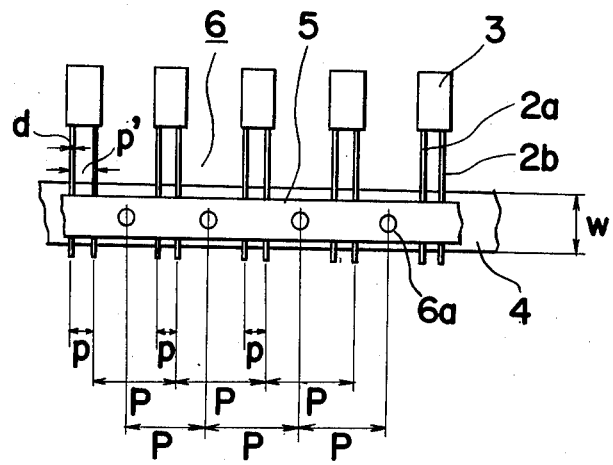
FIG. 5 is a plan view of a component substrate.

As shown in FIG. 5 each component substrate 6 comprises a pliable tape 4 of width W and a strip of adhesive tape 5 by which the outer end portions of generally parallel leads 2a and 2b of components 3 are held to the tape 4, the components 3 extending generally at right-angles to the line of advance of, i.e., to the longitudinal axis of, the component substrate 6. Each lead 2a and 2b has an approximate diameter $d$. The distance between inner sides of each pair of leads 2a and 2b is p, that between outer sides thereof is $p'$, and that between outer sides of lead 2a and lead 2b of adjacent components 3 is P. At regular intervals P in the component substrate 6 there are formed holes 6a, which pass both through the adhesive tape 5 and support tape 4, are defined centrally between leads of successive pairs of adjacent components 3, and are engageable by a sprocket wheel 14, described below, for effecting forward advance of the component substrate 6 in successive steps of interval P.

In FIGS,. 6 and 10, the rear end portion of each transport unit 1 defines a downwardly hooked portion 31 which may hook onto a retainer shaft 32, which is common to all transport units 1, and extends between and has opposite ends fixedly attached to upper portions of opposite side wals 36a of the substrate selection block 7. To a generally central portion of each transport unit 1 there is fixedly attached a downwardly extending catch element 33 which may be engaged in an opening formed in a retainer piece 35 fixedly mounted on the support board 34, the sides of the catch element 33 fitting exactlyin the retainer piece 35. Thus each transport unit 1 may be held in position on the support board 34, lateral and front to rear movement thereof being prevented by the retainer shaft 32 and a retainer piece 35, but the unit 1 may be easily and rapidly removed by first lifting the front end thereof upwards then moving the unit 1 rearwards to clear the hooked portion 31 thereof of the retainer shaft 32, as indicated by the two-direction arrow C of FIG. 10.

Figure 6:
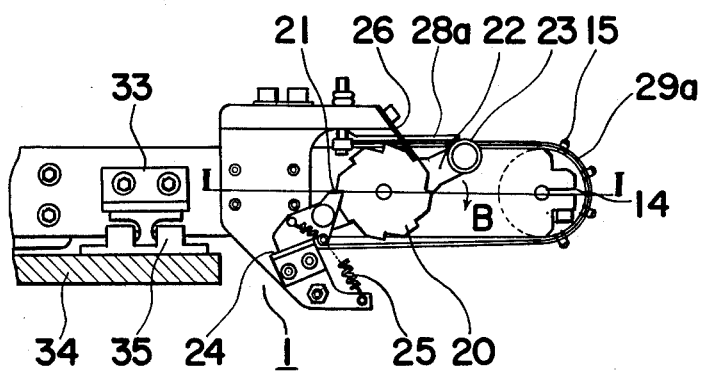
FIG. 6 is a side view of a transport unit for transport of a component substrate.

Referring to FIGS. 6 through 8, drive of each transport unit 1 is effected by means including the abovementioned sprocket wheel 14, a drive sprocket wheel 16, a drive ratchel wheel 20, and a pawl 21 for rotating ratchet wheel 20. The sprocket wheel 14 is freely rotatably on a shaft 18 fixedly mounted in a foremost end portion of the transport unit 1 and the periphery thereof has fixedly attached thereto radially disposed studs 15, at a pitch equal to the distance P between holes 6a in the component substrate 6, whereby successive studs 15 may engage successive holes 6a. The drive ratchet wheel 16 has the same number of radial studs as ratchet wheel 14 and is fixedly held by a screw 27 on one end portion of a shaft 19 which is parallel to and disposed rearwardly of the rotatory shaft 18 supporting the ratchet wheel 14, the drive ratchet wheel 16 and substrate engagement ratchet wheel 14 being connected by a timing belt 17.

The screw 27 may be tightened or loosened to vary tightness with which the sprocket wheel 16 is held on the shaft 19, and so effect fine adjustment of movement of the sprocket 16, and hence component substrate 6 advance, in response to drive imparted by the ratchet wheel 20.

The abovementioned ratchet wheel 20 is fixedly mounted on the opposite end portion of the rotatable shaft 19. Also mounted on the shaft 19, between drive sprocket wheel 16 and the ratchet wheel 20, there is a straight lever 22 which is freely pivotal about, and has a generally central portion thereof mounted on the shaft 19. The pawl 21 for causing advance of the ratchet wheel 20 is pivotally mounted on one end 22a of the lever 22 and is urged into a position for engagement of the ratchet wheel 20 by a compression spring 24 having one end fixed to an outer edge portion of the pawl 21 and the opposite end fixed to a portion of the lever 22 near the end 22a. A return spring 25 having one end fixed to a bracket fixedly attached to a main frame of the transport unit and the opposite end to a lever 22 portion near the end 22a exerts a constant force to bring the lever 22 into an alignement in which the pawl 21 is simply pressed into engagement with a tooth of the ratchet wheel 20 but does not exert any turning force on the ratchet wheel, this being the situation shown in FIG. 6. On the opposite end 22b of the lever 22 there is mounted a freely rotatably roller 23. Reverse movement of the ratchet wheel 20 is prevented by a spring plate element 26 having one end portion fixedly attached to a main frame portion of the transport unit 1 and extending to a position in which the opposite end portion thereof may engage successive teeth of the ratchet wheel 20.

As described in greater detail below, when the transport unit 1 is at a cut-off station B, the roller 23 is pushed downwards by a pusher 66 thus causing the lever 22 to pivot clockwise as seen in FIG. 6, and the pawl 22 to advance the ratchet wheel 20 one tooth pitch, whereby the drive sprocket wheel 16 fixed on shaft 19 is turned a distance equal to one interval P and, acting through timing belt 17, drives sprocket wheel 14 the same distance. In this manner the sprocket wheel 14 advances the component substrate 6 and brings successive components 3 to a cut-off line A—A at the foremost end of the transport unit 1, as shown in FIG. 9.

Figure 9:
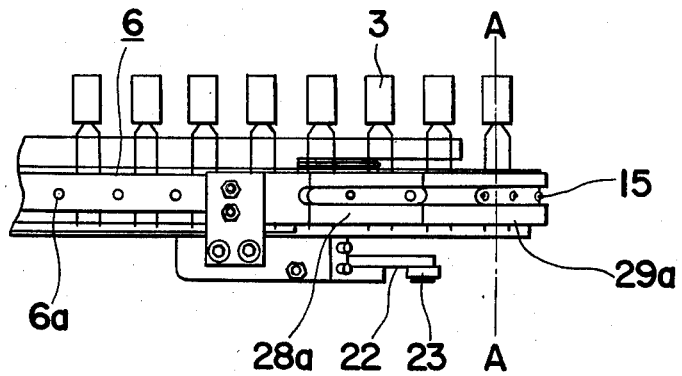
FIG. 9 shows the upper side of the front portion of a transport unit.

In FIGS. 8 and 9, to prevent ride-up of the component substrate 6 there is provided a press spring element 28a which has a rear end fixedly attached to a bracket 28b fixed to a lower portion of the main frame of the transport unit 1, and which extends along the lower front end portion and to a certain distance around the nose portion of the transport unit 1. On the inner side of the press spring plate 28a there is provided a hold-down belt 29a which is made of a material having a small co-efficient of sliding resitance and has one end fixed to the bracket 28b, and whose opposite end is attached to a one end of tension bracket element 29b, which is pivotal on a support 30 fixed on the transport unit 1 main frame and to whose opposite end is attached one end of a spring 29c whose opposite end is affixed to the transport unit main frame and which exerts a force to cause the bracket element 29b to pull the hold-down belt 29a.

Figure 11:
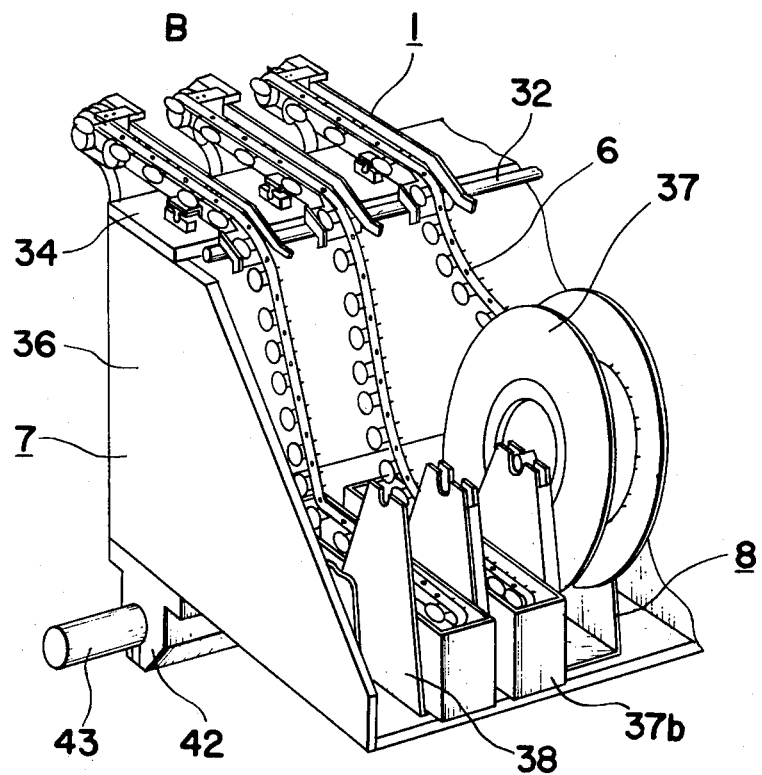
FIG. 11 is a rear perspective view of component initial supply means and transport units.
Figure 12:
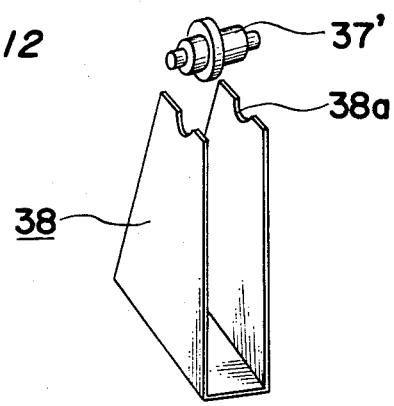
FIG. 12 is a detail perspective view of a supply reel and supply box stand.
Figure 13:
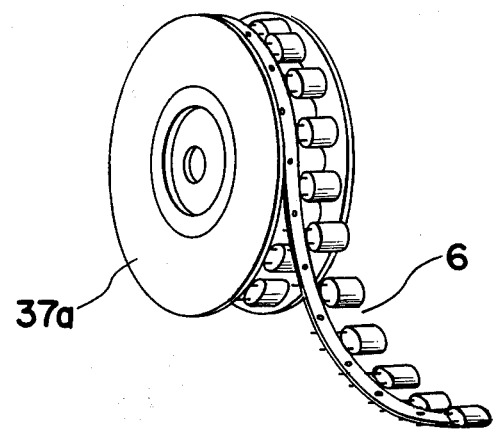
FIG. 13 is a perspective view of a component supply reel.
Figure 14:
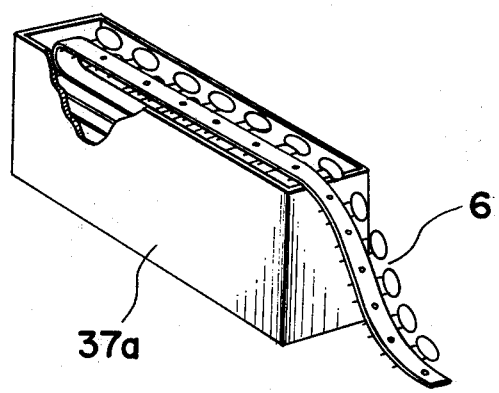
FIG. 14 is a perspective view partly in section of a component supply box.

Referring now to FIGS. 11 through 14, in the top edge portion of each wall 38 defining a reel stand 8 there is formed a semicircular notch 38a. The notches 38a of a pair of walls 38 defining one reel stand 8 serve to support opposite ends of a central shaft 37' which is in fixed connection to and projects to opposite sides of a reel 37 carrying a component substrate 6, a reel 37 supported in this manner being freely rotatable to permit gradual unwinding therefrom of the component substrate 6 due to the action of the sprocket wheel 14 at the front end of the corresponding transport unit, described above. If, however, it is required to initially provide a component substrate 6 in a box 37a, such as shown in FIG. 14, in which the component substrate 6 is folded in successive layers, the box 37a is simply placed in the bottom portion of a reel stand 8 defined by walls 38, as shown in FIG. 11, the component substrate 6 being led directly from the box 37a and gradually unwound therefrom as the corresponding transport unit 1 is actuated. Thus, as shown in FIG. 11, the apparatus of the invention permits two types of initial supply of component substrates 6, and in either case when all the components 3 of a component substrate 6 have been used a previous reel 37 or box 37a may be easily lifted from the reel stand 8 to permit rapid replacement by a reel 37 or box 37a carrying or containing a new component substrate 6.

Referring mainly to FIGS. 9 through 11, overall initial action of component feed is as follows. A plurality of component substrates 6 provided on reels 37 or in boxes 37 accommodated in stands 8 fixed on a lower, rear portion of the component selection block 7 are connected to a corresponding number of transport units 1 fixedly supported on an upper, forward portion of the block 7. To facilitate initial attachment of a component substrate 6 to a transport unit 1 the substrate 6 suitably has a leading end portion in which one or more engagement holes 6a are formed by which carries no components 3, although such a construction is not of course essential. Upon actuation of suitable switch means on the control panel 13 (FIG. 3) to select a particular component for mounting the component selection block 7 is moved left or right a sufficient distance to bring the component substrate 6 carrying the required component 3 into line with a cut-off station, generally indicated at B in FIG. 11. The component 3 which is at the front end portion of this component substrate 6, i.e., the component 3 in line with the cut-off line A—A indicated in FIG. 9 is actually at the cut-off station B and is detached from the selected component substrate 6 in a manner described below, after which the next component 3 carried thereby is brought to the line A—A. Upon subsequent actuation of a relevant switch on the control panel 13 the component selection block 7 remains stationary if the same component 3 is required, or, is moved in a requisite manner to bring the component substrate 6 carrying the selected component 3 into line with the cut-off station B, if a different component 3 is selected. Needless to say, it is not essential that components 3 be selected one at a time, but the circuit of the control panel 13 may be programmed to bring a succession of different component substrates 6 into line with the cut-off station B upon actuation of a single swich.

The description proceeds in reference to the cutter and transfer unit 9 and insertion unit 10.

Referring back to FIG. 4 the cutter and transfer unit 9 is pivotally mounted on a fixed pillar element 40a extending vertically upwards from the main frame portion 40, and is immediately adjacent to the centrally located insertion unit 10. The insertion unit 10 is supported by a principal frame 67 which is fixedly attached to fixed wall portions of the component mounting apparatus. Drive both to pivot the cutter and transfer unit 9 and to actuate the insertion unit 10 is supplied by a motor 115 through a clutch brake 116, both the motor 115 and brake 116 being mounted on a fixed platform 150 provided in an upper rear portion of the apparatus.

Figure 15:
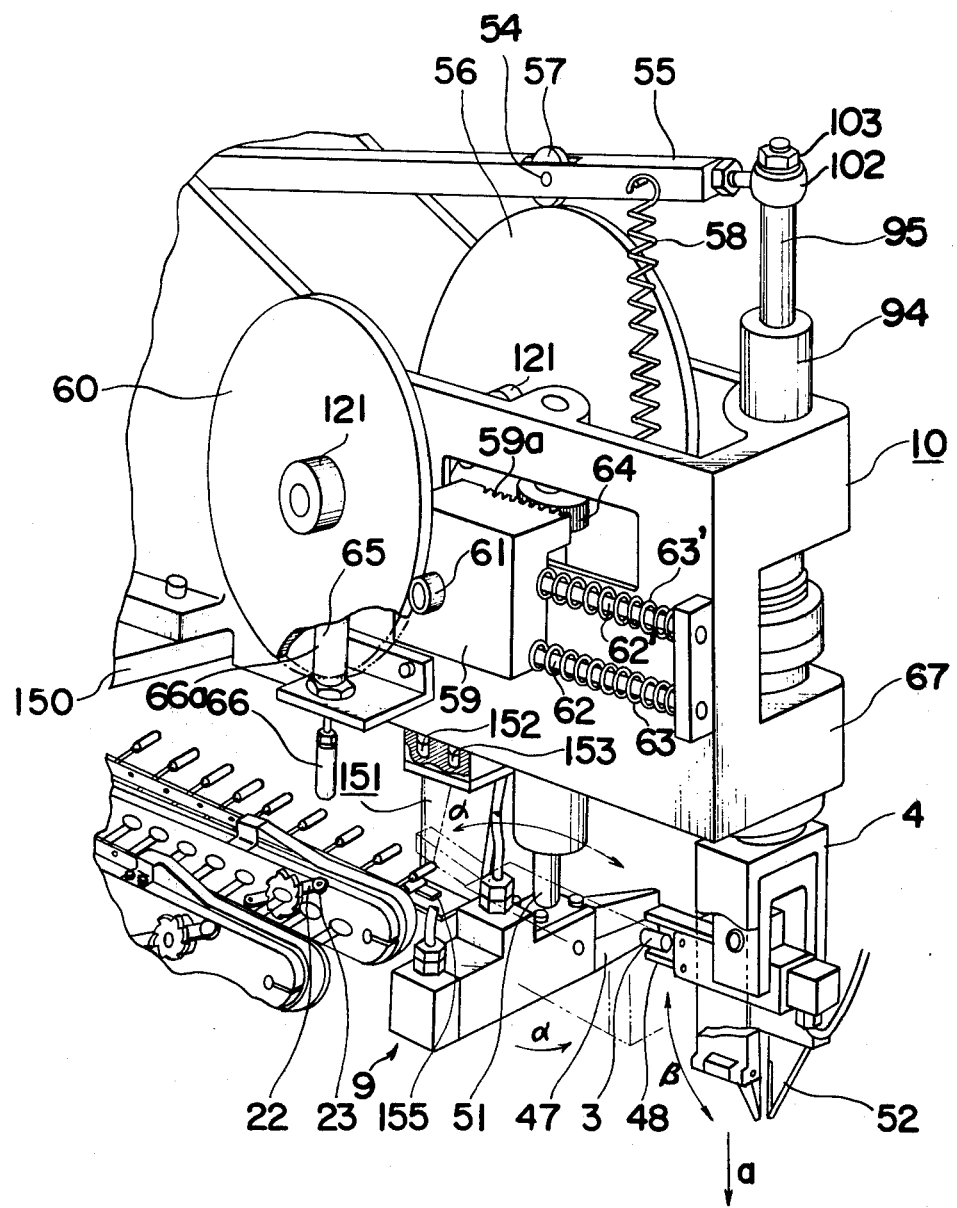
FIG. 15 is a general perspective view partly in section of a cutter, a transfer unit and an insertion unit and drive means therefor.
Figure 16:
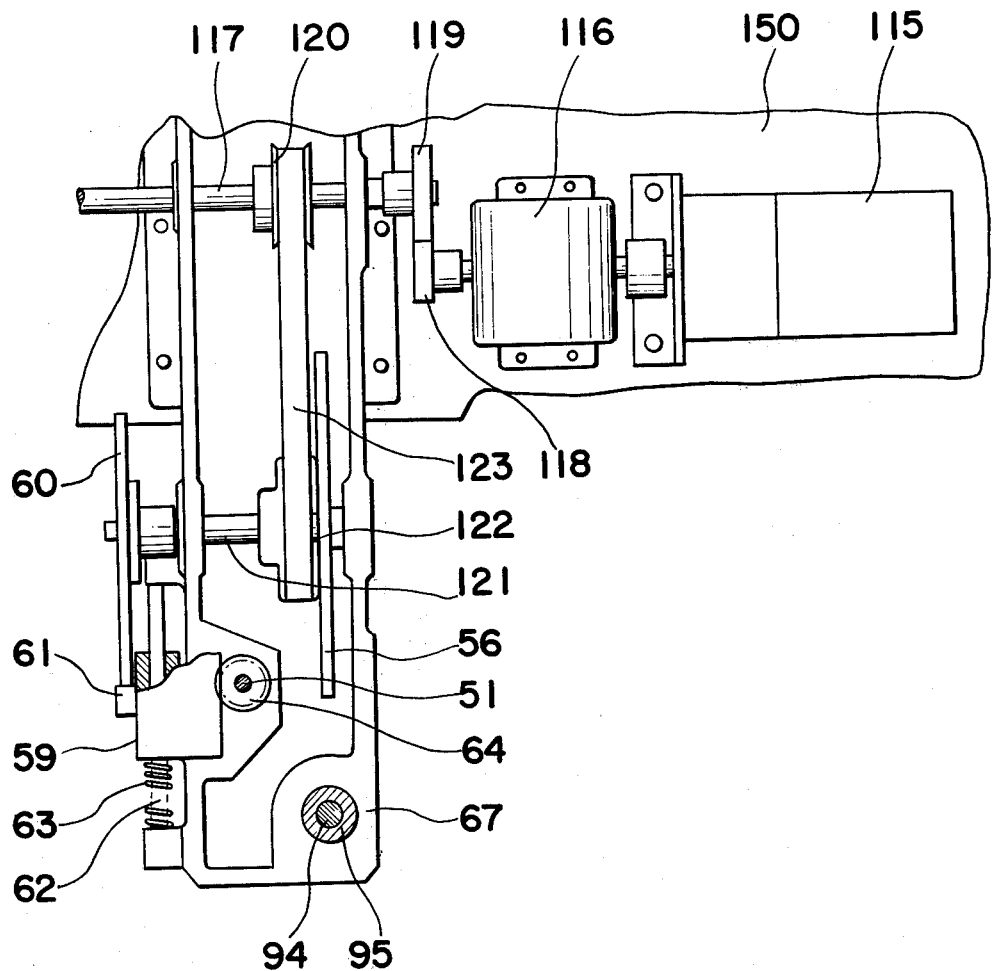
FIG. 16 is a horizontal cross-sectional view of drive means for the cutter and transfer unit and insertion unit of FIG. 15.

In more detail referring to FIGS. 15 and 16, the cutter and transfer unit 9 and insertion unit 10 are respectively disposed in a horizontal plane and a vertical plane, and are rotated and actuated by a return shaft 51 and slide shaft 95 which are respectively actuated in response to rotation of cams 60 and 56 fixedly mounted on a common shaft 121 having opposite ends rotatably supported in wall portions of the frame 67. Fixedly mounted on a generally central portion of the rotatable shaft 121 there is a timing pulley 122 which is connected by a timing belt 123 to a timing pulley 120 fixedly mounted on a drive shaft 117 having opposite end portions rotatably supported in side walls of the principal frame 67. Fixedly mounted on one end of the drive shaft 117 there is a gear 119 which is engaged by a gear 118 fixedly mounted on the output shaft of the clutch brake 116, whereby drive of the motor 115 may rotate the cams 60 and 56 fixedly mounted on shaft 121.

Referring more particularly to FIG. 15, the cam 56 is contacted by a cam roller 57 which is rotatably mounted on a fixed shaft 54 attached to an arm 55 which has one end pivotally mounted on a fixed wall portion of the principal frame 67 and whose opposite end connects to a ball bearing retainer ring 102 which is provided around an upper end portion of the abovementioned slide shaft 95 and contains ball bearings 104, not shown in FIG. 15 which actually contact the shaft 95. On the upper end of the slide shaft 95 there is screwed a screw 103 which acts to retain the inner race of the ball bearings 104 and maintain connection of the actuation arm 55 to the slide shaft 95. A compression spring 58 having one end attached to the arm 55 and the opposite end attached to the principal frame 67 acts to maintain the cam roller 57 in constant contact with the periphery of the cam 56. Rotation of the cam 56 causes alternate downward and upward movement of the slide shaft 95, causing actuation of the insertion unit 10 described in detail below.

Pivotal movement of the cutter and transfer unit 9 is controlled by a vertical shaft 51 which is rotatably supported in suitable bearing portions of the principal frame 67, and whose lower end is in fixed connection with a portion of the cutter and transport unit 9 in line with the pivotal centre of the unit 9. A gear wheel 64 is fixedly attached to an upper portion of the drive shaft 51. The gear wheel 64 engages a rack 59a defined in one face of a block 59 which is laterally slidable on a pair of fixed horizontal shafts 62 and 62' which are supported by the principal frame 67. Around the shafts 62 and 62' there are provided springs 63 and 63' which each have one end contacting the side of the slide block 59 and the opposite end contacting the princpal frame 67, and which both act to urge the block 59 leftwards as seen in FIG. 15. Pivotally mounted on another face of the slide block 59 there is a cam roller 61 which contacts the periphery of the cam 60, maintenance of this contact being ensured by the action of the springs 63 and 63'. Thus rotation of the cam 60 causes left or right movement of the slide block 59, and, because of engagement of the rack 59a and gear 64, clockwise or counterclockwise rotation of the shaft 51 and cutter and transfer unit 9.

Figure 17:
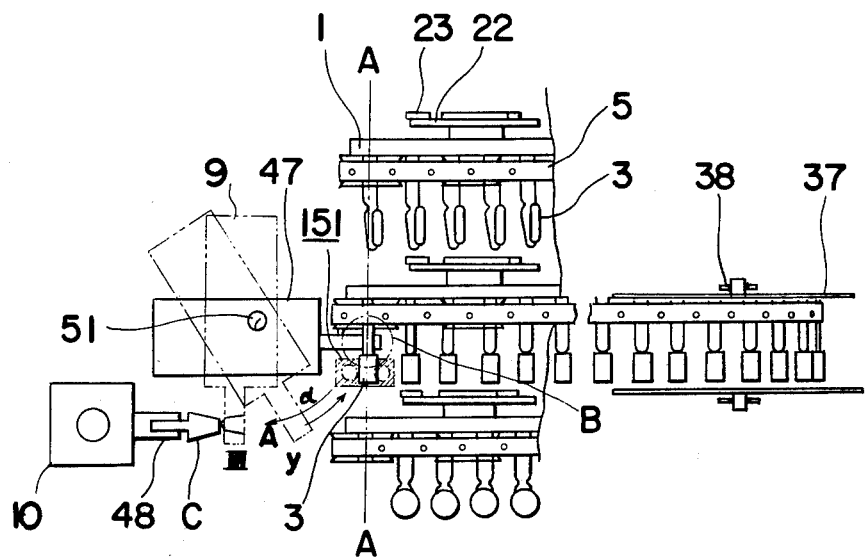
FIGS. 17 and 18 are respectively plan and side view in illustration of cutter and transfer unit and insertion unit action.

Referring to FIG. 17, for each component 3 mounted rotation of the cam 60 causes the following movement of the cutter and transfer unit 9. The unit 9 is normally held in a position A in which it is inclined with respect to and can not be contacted by transport units 1, which may therefore be freely moved by the component selection block 7 to bring a required component substrate into line with the cut-off station B, as described above. When the required component substrate 6 has been brought into line with cut-off station B the unit 9 is pivoted clockwise as seen in the drawing and moved from position A into an alignment in which the cutter and holder portion 47 thereof, described below, is brought to cut-off station B, whereupon the cutter and holder portion 47 detaches the foremost component 3 from the selected component substrate 6 and holds this component 3. Next, as cam 60 continues to rotate, the unit 9 is rotated clockwise through an angle $\alpha$ whereby the cutter and holder portion 47 thereof is brought to a transfer C whereat the detached component 3 is received and held by a chuck portion 48 of the insertion unit 10, after which the cutter and holder portion 47 releases the component 3 and the cutter and transfer unit 9 is returned to position A, where it remains until a next component 3 is to be detached.

Referring back to FIG. 15, mounted in vertical alignment on a support bracket fixedly attached to the principal frame 67 there is a hydraulic cylinder unit 66a including a piston which controls a downwardly inclined pusher 66 which is positioned directly above the roller 23 of the ratchet actuation lever 22 (shown in detail in FIG. 6) of the component substrate 6 in line with cut-off station B. The hydraulic cylinder unit 66a is actuated in response to signals from a detection block 151 which includes a photoemissive diode 152, or other suitable light source, photosensitive diode 153, detection block support bracket 154 which is affixed to principal frame 67, and reflecting mirror 155. The photoemissive diode 152 is positioned vertically above the cut-off station B. i.e., vertically above the location at which a component 3 must be for detachment thereof from its substrate 6, and the mirror 155 is located vertically in line with the photoemissive diode 152 and below the cut-off station B, and is positioned to reflect incident light to the photosensitive diode 153, which is suitably located near to the photoemissive diode 152. Construction of the actuation control circuit of the hydraulic cylinder unit 66a is such that, subsequent to actuation of a component mounting action start switch on the control panel 13 (FIG. 4) and movement of the component selection block 7 to bring a required component substrate into line with the cut-off station B, when light is received by the photosensitive diode 153 from the mirror 155, i.e., when there is no component 3 at the cut-off station, B the hydraulic cylinder unit 66a is actuated to cause the pusher 66 to move downwards and push the roller 23, so causing the lever 22 to pivot clockwise and cause the transport unit 1 to move the component substrate 6 forward a distance P, in the manner described above in reference to FIGS. 6 through 8, this action being effected only once or being repeated as many times as necessary until a next component 3 is brought to the cut-off station B. Otherwise the hydraulic cylinder unit 66a is unactuated and the pusher 66 remains in the raised position shown in FIG. 15.

The end of the lever 22 contacted by the pusher 66 may of course simply be an integral portion of the lever 22, but provision of the roller 23 reduces friction during actuation of the lever 22.

Since the detection block 151 is required to detect presence of components 3 of various sizes on different component substrates 6, it is of course necessary that the photoemissive diode 152 be positioned above a generally central portion of the body of a component 3 brought to the cut-off station B, and emit a narrow ray of light not exceeding half the width of the smallest component 3 to be detected.

In FIGS. 15 and 17, by this action of the pusher 66, therefore, considering only the transport unit 1 in line with the cut-off station B, when a foremost component 3 is removed by cutter and transfer unit 9 and unit 9 is swung clockwise from cut-off station B, light emitted by photoemissive diode 152 is allowed to be reflected by mirror 155 to photosensitive diode 153, and pusher 66 is actuated to cause the component substrate 6 to be advanced one pitch P. If there is present a component 3' immediately after the component 3 which has just been detached, pusher 66 action is now stopped, but if, because of a fault in initial production of the component substrate 6 or similar reason, the component which should follow the detached component 3 is missing, light is still directed onto the photosensitive diode 153 even after this advance of the component substrate 6, and the pusher 66 is again actuated to cause the component substrate 6 to be moved forward a distance P, this action being repeated if necessary, to bring a subsequent component 3 to the cut-off station B and prevent impingement of light on photosensitive diode 153 and so terminate action of the pusher 66. Thus, on each transport unit 1 a component 3 is always brought to the line A-A of FIG. 17, and ready for subsequent cut-off at the cut-off station B. In other words, there is no possibility of 'empty' actuation of the cutter and transfer unit 9 and insertion unit 10, and requisite components 3 are always mounted in correct locations on printed circuit boards 12.

Details of construction of the cutter and transfer unit 9 are now given in reference to FIGS. 19 through 21(b).

Figure 19:
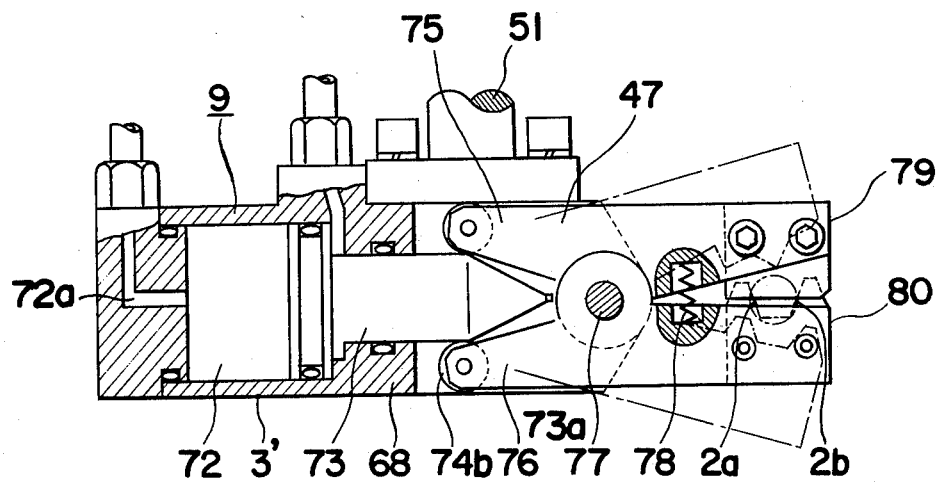
FIG. 19 is a cross-sectional view showing cutter and transfer unit construction.

Considering first FIG. 19, unit 9 comprises a main body portion 68 in which is defined a cylinder 72 which communicates with a fluid medium supply, not shown, through one or more passages 72a also defined in the main body portion 68, and in which is slidably accommodated a piston 73 having a conical nose 73a. During supply of fluid medium to move the piston 73 forward, i.e., from left to right as seen in the drawing, the piston conical nose 73a contacts and gradually pushes apart a pair of rollers 74a and roller 74b which are on opposite sides of the nose 73a and are respectively mounted on the rear end of an upper lever 75 and the rear end of a lower lever 76. The upper lever 75 and lower lever 76 are both pivotally mounted on a pivot shaft 77 fixedly supported in the main body portion 68 and the front ends thereof define jaws 79 and 80, respectively, the levers 75 and 76 and jaws 79 and 80 thereof together constituting the abovementioned cut-off and holder portion 47 of the unit 9. An expansion spring 78 mounted on a forward portion of the main body portion 68 exerts a constant pressure on the levers 75 and 76 to hold to jaws 79 and 80 thereof open, as indicated by the chain-dot line portion of FIG. 19, but the jaws 79 and 80 are caused to close to the position indicated by the solid line portion of the drawing by the forward stroke action of the piston 73. When fluid medium is withdrawn from the cylinder 72, the spring 78 pivots the levers 75 and 76 to again open the jaws 79 and 80, the piston 73 being simultaneously moved leftwards by the levers 75 and 76 thus pivoted, due to contact of the rollers 74a and 74b with the piston nose 73a.

Figure 20:
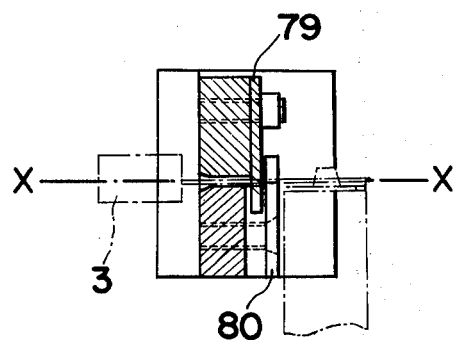
FIG. 20 is a vertical cross-sectonal view showing details of the cutter blades of the cutter and transfer unit.
Figure 21A:
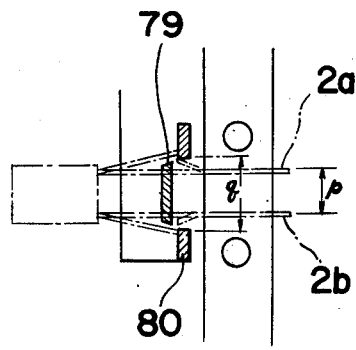
FIG. 21(a) is a cross-sectional view taken along the line X—X in FIG. 20.
Figure 21B:
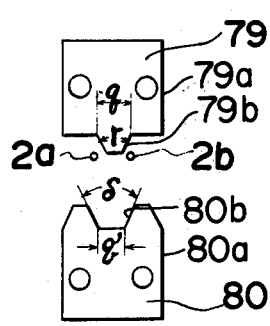
FIG. 21(b) is a front elevational view of upper and lower cutting blades.

Configuration of the jaws 79 and 80 is shown in detail in FIGS. 20 and 21(a) and 21(b) to which reference is now had. Seen facing the outer end of the levers 75 and 76, jaw 79 has a profile defining a flat, non-cutting portion 79a and a downwardly extending blade 79b, and jaw 80 has a profile defining a flat, non-cutting portion 80a, which is generally parallel to the flat portion 79a of the other jaw 79 when the jaws 79 and 80 are closed, and a recessed cutting portion 80b. When the cutter and transfer unit 9 is brought to cut-off station B the jaws 79 and 80 lie between the main body of a leading component 3 and the component substrate 6, the flat portions 79a and 80a being nearer to the main body of the component 3 and the blade 79b and cutter portion 80b to the component substrate 6, as shown in FIG. 20.

As indicated schematically in FIG. 21 (a) and FIG. 21 (b), configuration and dimensions of the blade 79b and cutter portion 80b are as follows. The blade 79b has a flat nose and flanks which are inclined to the blade nose at an angle $\gamma$ and meet the main body of the blade 79b to define a root of diameter $q$, which is greater than the outer side distance $p'$ of leads of a component 3 attached to a component substrate 6 (see FIG. 5). The recessed cutter portion 80b defines a flat bottom of width $q'$ which is smaller than root diameter $q$ of the blade 79b but larger than lead outer side distance $p'$ and defines flanks inclined to the flat bottom at an angle $\delta$ which is smaller than the flank angle $\gamma$ of the blade 79b.

Figure 22:
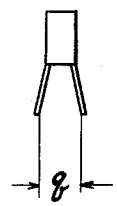
FIG. 22 is a schematic view illustrating component lead configuration.

As the jaws 79 and 80 close on the leads 2a and 2b of component at the cut-off station B, the leads 2a and 2b are first contacted by the blade 79b whose flanks gradually push the leads 2a and 2b apart to separate the lead ends nearer to the component substrate by a distance $q$. This separation of the leads 2a and 2b is of course accompanied by a certain loosening thereof in the component substrate 6, but this is not of importance since the leads 2a and 2b are immediately held by the jaws 79 and 80. During this separation of the leads 2a and 2b, the blade 79b gradually moves into the recessed cutter portion 80b, and after sufficient advance thereof into the cutter portion 80b separation between the flanks of the blade 79b and of 80b becomes nil and the wires 2a and 2b, now separated to a distance $q$ as shown in FIG. 22, are cut. When this cutting action takes place, the jaws 79 and 80 have closed sufficiently for the flat portions 79a and 80a thereof to be brought generally parallel to one another and be separated by a distance which is very slightly greater than the diameter $d$ of the leads 2a and 2b, whereby the leads 2a and 2b are held by the jaws 79 and 80, the component 3 thus being supported by the cut-off and transfer unit 9, which is now pivoted to the transfer station C, as described above.

Figure 18:
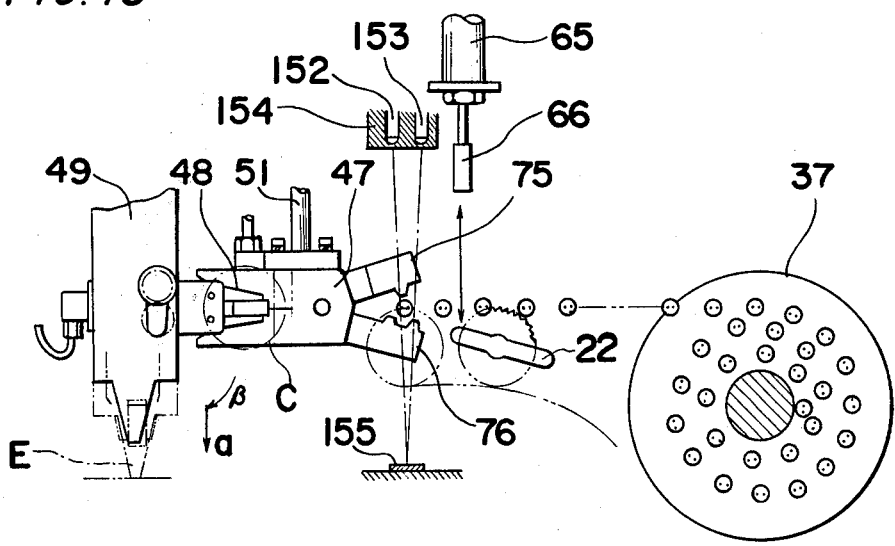

Referring back to FIGS. 15 and 16, rotation of the cam 56, which is rotated simultaneously with the cam 60 and is contacted by the roller 57, causes up and down movement of vertically aligned shaft 95, and this in turn causes up and down movement through a distance 'a' of insertion guides 52, shown in the lower right-hand portion of FIG. 15, accompanied by simultaneous pivoting of the chuck element 48 through an angle $\beta$ in a vertical plane.

in FIGS. 17 and 18, downward movement of the shaft 95 occurs after transfer of a detached component 3 from the cutter and transfer unit 9 to the chuck element 48 of the insertion unit 10 and causes the chuck element 48 to be pivoted downwards from a horizontal alignment, in which it is normally held in readiness to receive a component 3, to a vertical alignment, in line with the insertion head 52, while the insertion guides 52 are moved down to an insertion station E immediately above the upper surface of a printed circuit board 12, as indicated by the two-dot chain line portion of FIG. 18, When the shaft 95 is subsequently raised, due to continued rotation of the cam 56, the insertion head 52 is again raised to the normal upper position and the chuck element 48 again brought to the normal horizontal alignment indicated by the solid line portions of FIG. 18 by spring and gear means described later.

First the chuck element 48 is described in reference to FIG. 23. The chuck element 48 comprises a main body portion 81 defining a cylinder 83, which communicates through one or more passages 83a to a fluid medium supply not shown, and provides sliding accommodation for a piston 84 having a conical nose 84a. The piston 84 is normally held in a neutral position by a return spring 93 provided therearound, but may be moved in a forward stroke, righwards as seen in FIG. 23, upon intake of fluid medium into the cylinder 83. When the piston 84 is thus moved forward the conical nose 84a thereof contacts and gradually separates rollers 84 and 85 rotatably mounted on the rear ends of levers 86 and 87, respectively, which are independently and pivotally mounted on pivot shafts 88 fixed to the main body portion 81, and whose forward ends define chuck jaws 86a and 87a, the chuck jaws 86a and 87a thus being closed by forward stroke action of the piston 84. The jaws 86 and 87 are closed in this manner when a component 3 is brought to the transfer station C by the cutter and transfer unit 9, whereby the chuck element 48 grips the main body of the component 3. The cutter and transfer unit 9 then releases the component 3, but the chuck element jaws 86 and 87 still hold the component 3 and remain closed until the chuck element 48 has been pivoted into a vertical alignment between a pair of insertion guides 52 described below. An expansion spring 89 provided between forward portions of the levers 86 and 87 acts to re-open the jaws 86a and 87a upon the return stroke of the piston 84. Attached to the inner surface of each jaw 86a and 87a there is a comparatively thick layer of resilient material 90 which permits the jaws 86a and 87a to securely grip components 3 of different sizes, without risk of causing damage to larger components 3. The main body portion 81 also has small flange portions 91 which extend from a shaft accommodation hole 91a in which fits a shaft 106a, for pivoting the chuck element 48, the shaft 106a being held tightly in the accommodation hole 91a by tightening of a screw 92 connecting the flanges 91.

Referring now to FIGS. 24 through 26, the shaft 106a secured to the chuck element 48 has fixedly mounted thereon a pinion 106, and has opposite ends supported in a flange portion 107 which constitutes or is in fixed or integral attachment to the lower end of the abovementioned slide shaft 95 which is caused to move up and down due to action of cam 60 (FIG. 15) acting through arm 55.

The slide shaft 95 is slidable in a sleeve shaft 94, which is itself slidable in and held vertical by front end portions 67a and 67b of the principal frame 67. Between the principal frame portions 67a and 67a there is defined a recess 67c. Part of the outer periphery of that portion of the sleeve shaft 95 which lies in the recess 67c defines external threads on which are screwed a large diameter positioning nut 101 having a function described below and a jam nut 101' holding the positioning nut 101 in place.

The upper end portion 95a of the slide shaft 95 extends to a certain distance above the top of the sleeve shaft 94, and around this upper portion 95a there is provided an expansion spring 105 whose lower end is attached to the top of the sleeve shaft 94 and whose upper end is attached to the ball bearing retainer 102 via which the actuation arm 55 connects to the slide shaft 95.

The lower end portion of the sleeve shaft 94 has fixedly or integrally attached thereto a flange portion 110 which supports a pair of insertion guides 52. The insertion guides 52 constitute the lowermost portion of the insertion unit 10, define an open-side portion into which the chuck element 48 may swing to come into a vertical alignment between the guides 52, and are inclined towards one another to define a lowermost exit 52a of width S. When the chuck element 48 is in a vertical alignment the rear portion of the main body 81 thereof contacts a stopper 113 (FIG. 25). The flange portion 110 also defines a slide groove 109 providing slidable accommodation for a rack 108 which is engageable by the pinion 106 mounted on the chuck element pivot shaft 106a. The upper end of the groove 109 is open and the lower end thereof is closed. In a lower portion of the groove 109 there is mounted a spring 111 which exerts a constant force to move the slide rack 108 upwards and cause the top of the rack 108 to press against the lower surface 67b" of the principal frame portion 67b.

Action of the insertion unit 10 is as follows. In FIG. 24, when a component 3 is transferred by the cutter and transfer unit 9 to the chuck element 48 at the transfer station C the actuation arm 55 holds the slide shaft 95 and, acting through the spring 105, the sleeve shaft 94 in uppermost positions. In this situation the positioning nut 101 on the central portion of the sleeve shaft 94 is a distance 'a' above the upper surface 67b' of the principal frame portion 67b, the slide rack 108 is pressed by spring 111 against the lower surface 67b" of the frame portion 67b, the pinion 106 on the chuck element pivot shaft 106a engages the rack 108, and the angular position of the pinion 106 is such that the chuck element 48 is held horizontal. Once the jaws 86 and 87 have closed to hold the component 3 and the component 3 has been released by the cutter and transfer 9 the actuation arm 55 starts to move downwards.

Downward movement of the actuation arm 55 causes the slide shaft 95 to move downwards due to the connection of arm 55 and shaft 95 by the nut 103 and ball bearing retainer 102, and at first also causes downward movement of the sleeve shaft 94, because of pressure transmitted through the spring 105. However, downward movement of the sleeve shaft 94 is terminated when the positioning nut 101 thereon comes into contact with the upper surface 67b' of the principal frame portion 67b. When this contact occurs, the insertion guides 52 supported by the flange 110 at the bottom of the sleeve shaft 94 have therefore been moved downwards a distance 'a', which is sufficient to bring the exit 52a to just above the surface of a printed circuit board 12, whereby leads 2a and 2b may be inserted into corresponding holes in the circuit board 12 without there being any application of pressure on the circuit board 12 by the insertion unit 10.

During this downward movement of the shaft 94 and 95, although the flange 110 attached to the sleeve shaft 94 is also moved downwards, the pressure applied by the spring 111 on the slide rack 108 maintains the top of the rack 108 in contact with the lower surface 67b" of the frame portion 67b, and the upper portion of the rack 108 is slid out of the groove 109 formed in the flange 110 as the sleeve shaft 94 moves down, or more strictly the groove 109 slides out of contact with rack 108 upper portion. In other words, rack 108 remains stationary, and therefore causes rotation of the pinion 106 and of the chuck element 48.

After downward movement of the sleeve shaft 94 has stopped, the actuation arm 55 continues to move downwards, spring 105 being gradually compressed, and slide shaft 95 continues to be moved downwards and chuck element 48 continues to be rotated due to engagement of the pinion 106 with rack 108 until the chuck element 48 has been brought into a vertical alignment, the rear portion thereof being in contact with the stopper 113 and the jaws 86 and 87 thereof holding the component 3 at the entrance of the insertion guides 52, as shown in FIG. 25. At this stage, the pinion 106 is at the lowermost portion of the rack 108, whereby further downward movement of the slide shaft 95 does not cause further pivoting of the chuck element 48.

In FIG. 26, slide shaft 94 is moved down a slight distance further during which movement the chuck element 48 moves the component 3 downwards. The width S of the exit 52a is sufficient to permit passage of the largest component 3 to be mounted and is slightly less than the distance $q$ to which the leads 2a and 2b are separated by the cutter and transfer unit 9. Thus as the exit 52a is approached, the leads 2a and 2b are gradually pressed towards one another by the guides 52 and then move through the exit 52a and are guided accurately into holes in a printed circuit board 12 immediately below the guides 52. The lower portion of the main body also of the component 3 is moved into contact with the upper surface of the circuit board 12, and simultaneously with this action the leads 2a and 2b thereof are clipped and bent by a clinching unit 136 in a manner described below.

Next the jaws 86 and 87 of the chuck element 48 are opened to release the component 3, the actuation arm 55 raises the shafts 94, and 95, the pinion 106 again comes into engagement with the rack 108 whereby the chuck element is rotated upwards again, and the insertion unit 10 is returned to the initial state shown in FIG. 24, the guides 52 at this time being clear of the inserted component 3.

Referring back to FIG. 4, the positioning support 11 for bringing requisite portions of a printed circuit board 12 into vertical alignment with the insertion unit 10 is constructed and functions as follows. The positioning support 11 is supported on a horizontal platform 125 which is fixed to a forward portion of the apparatus main frame 40. On the platform 125 there is fixedly mounted a pair of parallel slide shafts 126 which are disposed in a left to right alignment with respect to the mounting apparatus, and on which is slidably mounted a horizontally disposed X frame 127. A pulse motor 128 mounted on a forward portion of the platform 125 connects directly to a ball screw 129 which engages a ball nut 130 affixed to a forward edge portion of the X frame 127 whereby actuation of the pulse motor 128 may cause leftward or rightwrd movement rightward the X frame, i.e., along the X—X axis indicated in the drawing. Fixedly mounted on left and right edge portions of the X frame 127 there are a pair of parallel slide shafts 131 which are disposed parallel to a Y—Y axis which is normal to the X—X axis and on which is slidably mounted a horizontal Y frame 132. A pulse motor 133 mounted on a right edge portion of the X frame connects directly to and drives a ball screw 134 which engages a ball nut 135 mounted on a side edge portion of the Y frame 132, whereby actuation of the pulse motor 133 can cause forward or rearward movement of the Y frame 132, along the Y—Y axis. Thus the Y frame 132 is constrained to move with the X frame 126 along the X—X axis, but may be moved independently along the Y—Y axis.

The central portions of the X frame 126 and Y frame 132 are open, the positioning unit 11 thus defining a central hollow portion for accommodation of the clinching unit 136, described below. A printed circuit board 12 may be held flat in a reference position by suitable clamp or jig means not shown in the upper surface of the Y frame 132. Thus by suitable actuation of the pulse motors 128 and 133 the printed circuit board 12 may be moved requisite distances, in requisite directions, along the X—X and Y—Y axes and successive board 12 portions on which components 3 are to be mounted can be brought the insertion station E under the insertion unit 10.

Figure 27:
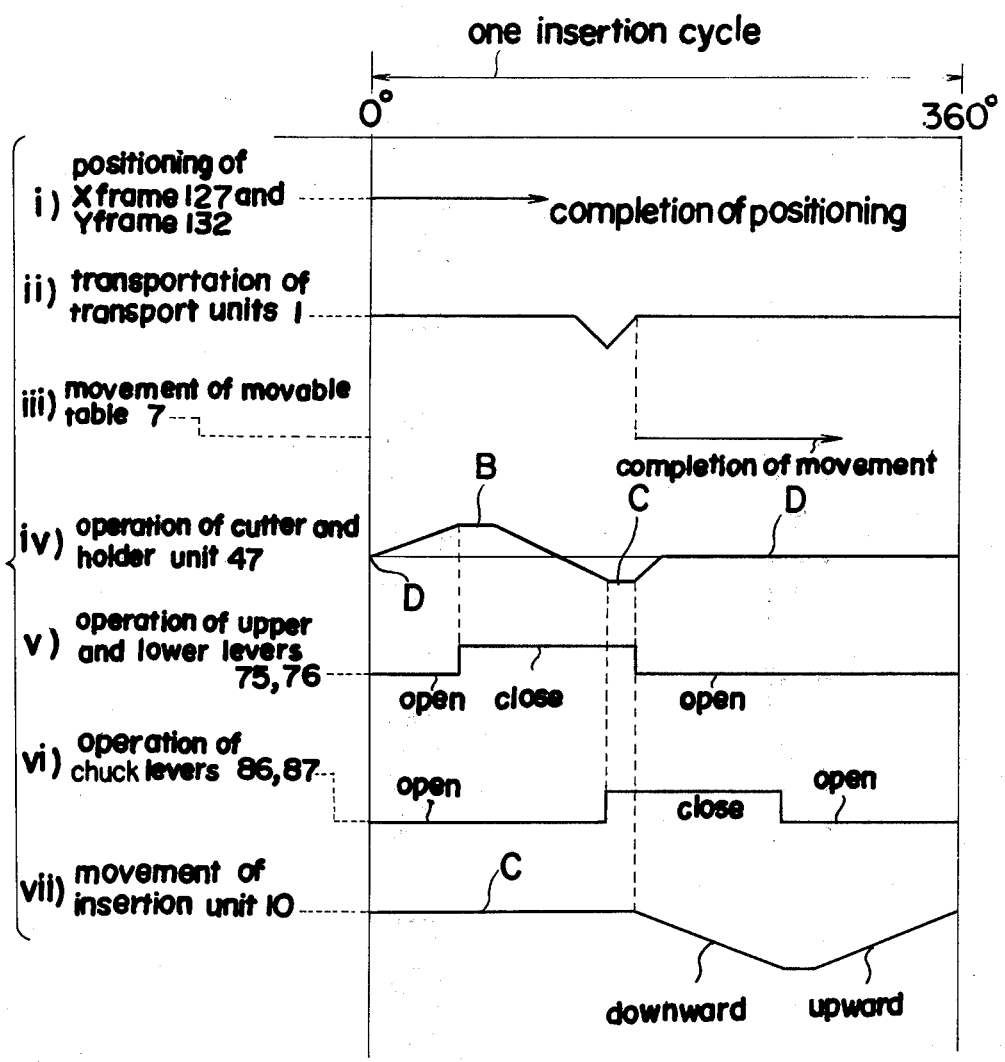
FIG. 27 is a timing chart of action of various units during insertion of one component.

Referring now to the timing chart of FIG. 27, overall action of the abovedescribed means in one insertion cycle, i.e., in insertion of one component 3, is as follows. At the start point, 0° in the chart of FIG. 27, the X frame 127 and Y frame 132 are stopped at previously determined positions to hold a requisite part of the printed circuit board 12 at the insertion station E for mounting of a previous component 3, the component substrate 6 carrying components 3 of the type next required to be mounted has been brought into line with the cut-off station B, the cutter and transfer unit 9 is at the neutral position A, the insertion unit 10 is raised, and the chuck element 48 of the insertion unit 10 is at the transfer station C. When an insertion signal is received X frame 127 and Y frame 132 start to move to bring the board 12 portion for reception of the next component 3 to the insertion station E, while the cutter and transfer unit immediately moves to the cut-off station B, levers 75 and 76 of the cutter and transfer unit 9 close, the leads 2a and 2b of the component 3 are detached from the component substrate 6 and the component 3, supported by the cutter and transfer unit 9 holding the leads 2a and 2b, is transported to transfer station C.

When the unit 9 moves the component 3 away from the cut-off station B, the transport unit 1 is actuated to advance the component substrate 6 and bring the next component 3 on this component substrate 6 to the cut-off station B, and when the unit 9 passes the neutral position A the component selection block 7 is moved in a requisite manner to bring the component substrate 6 carrying the next type of component 3 required to be mounted into line with the cut-off station B.

At the transfer station C levers 86 and 87 of the insertion unit 10 close, to hold the main body of the detached component 3, after which the levers 75 and 76 of the cutter and transfer unit 9 open, thus completing transfer of the component 3, and the unit 9, returns to the neutral position A.

By this time positioning of the printed circuit board 12 is completed and chuck element 48 is pivoted downwards while insertion unit 10 as a whole is lowered the leads 2a and 2b of the component 3 are guided by the guides 52 into holes in the circuit board 12, the component 3 is passed between the guides 52, the chuck element 48 releases the component 3, and the insertion unit 10 is again raised, the chuck element being returned to the transfer station C, thus completing one insertion cycle.

The clinching unit 136 is now described, in reference to FIGS. 28 through 32.

Figure 28:
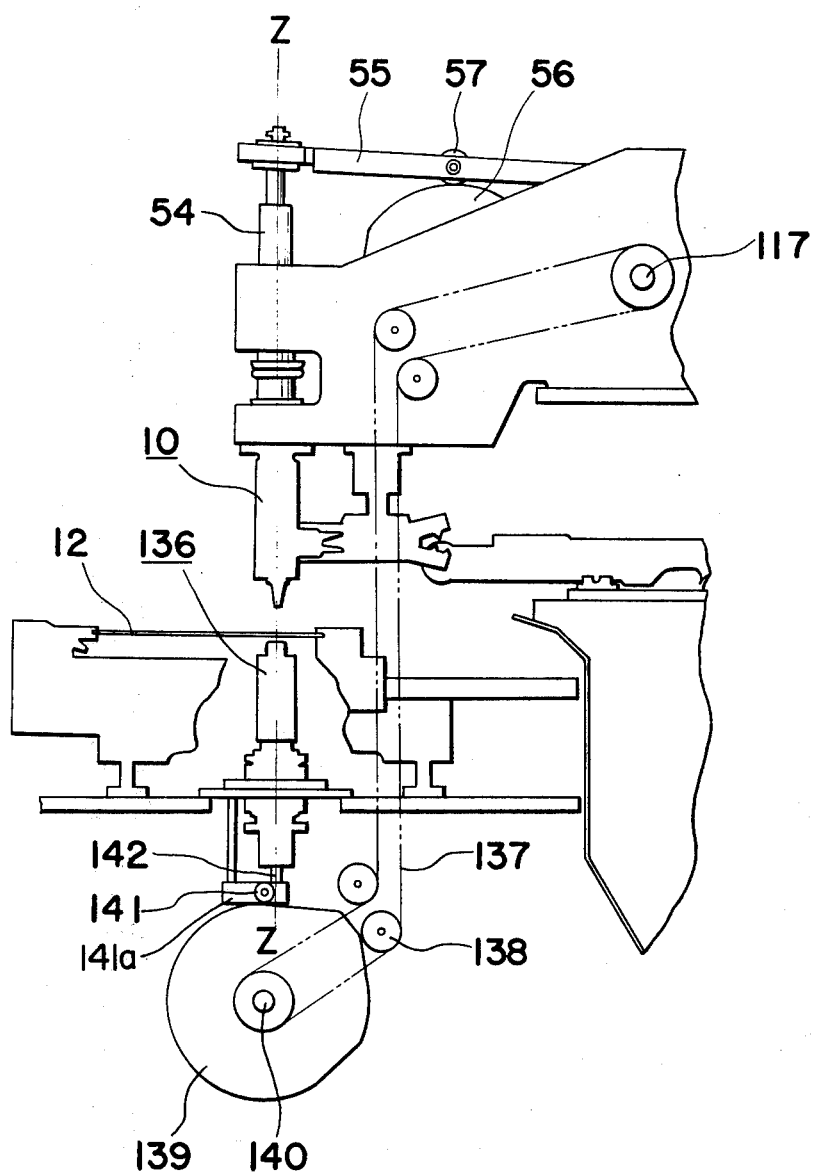
FIG. 28 is a schematic view showing the drive mode of a clinching unit and the positional relation thereof with respect to the insertion unit.

As shown in FIG. 28, the clinching unit 136 is positioned below the printed circuit board 12, is vertically in line with the insertion unit 10, and is movable along a vertical Z—Z axis towards and away from the lower surface of the circuit board 12. Z—Z axis movement of the clinching unit 136 is caused by a rotary cam 139 whose periphery is contacted by a cam roller 141 rotatably mounted on a horizontal support rod 141a which is fixedly attached to the lower end of a vertically disposed centre rod 142 extending upwards into the main body portion 145 of the clinching unit 136. The shaft on which the cam 139 is mounted is rotated by a chain 137 which is passed round a plurality of tension rollers 138 and is also passed around and is driven by the abovementioned drive shaft 117 which acts to drive cutter and actuation unit actuation cam 160 and insertion unit actuation cam 56 (FIG. 16). In other words actuation of the cutter and transfer unit 9, insertion unit 10, and clinching unit 136 is synchronized, and actuation of all these units together may be speeded by simple alteration of the rotatory speed of the single drive shaft 117.

As shown in greater detail in FIGS. 29(a) and 29(b), the cam roller 141 is maintained in contact with the cam 139 by a spring 143 having an upper end attached to an end of the horizontal rod 141a and a lower end attached to a rod 143a which is fixed to the lower end of a support bracket 149 which supports a rotatory cylinder 148, and has an upper end portion fixed to a rigid, horizontal main support base 156. Also affixed to the base 156 is a vertically disposed flange or sleeve element 165 in which a housing 164 is in screwed attachment, the housing 164 defining an external thread portion 163 which engages corresponding internal thread portion formed in the flange portion 165, which permits the housing 164 to be raised or lowered, and fixed in different positions to cause the lower end 164a thereof to project a smaller or greater distance below the level of the base 156.

The fixed housing 164 is disposed around and provides slidable support to the main body portion 145 of the clinching unit 136, and the centre rod 142 is connected by spring 144 to and is slidable in the main body portion 145. The lower portion of the main body portion 145 extends below the main base 156 and the periphery thereof defines spline portion 146 which is engaged by the teeth of a horizontally disposed pinion 147 which is rotatable by the rotatory cylinder 148, whereby the clinching unit main body portion 145 may be slid upwards or downwards with respect to the pinion 147 and may also be rotated thereby to any required angular position. A stopper ring 166 is fixedly attached to the lower portion of the main body portion 145, above the threaded portion 146. In the rest position of the clinching unit 136 the stopper ring 166 is a distance m below the lower end 164a of the housing 164.

The upper portion of the main body portion 145 accommodates a pair of levers 158 and 159 which are pivotally supported on a fixed pin 157 and on whose lower ends are fixed pins 168 and 168' respectively. Pivotally mounted on the pins 168 and 168' respectively are rollers 169 and 169' which are contactable by a conical element 167 fixedly attached to the upper end of centre rod 142 and which, when the centre rod 142 is slid upwards in the main body portion 145, are caused to move apart by the conical element 167, whereby cutters 161 and 160 defined at the upper ends of the levers 158 and 159 respectively are caused to move in opposite directions to meet dies 162 and 162' respectively which are fixedly mounted on the uppermost portion of the main housing portion 145, only cutter 161 and anvil portion 162 being shown clearly in FIG. 29(a), and the levers 158 and 159 being normally urged by suitable spring means not shown into positions in which the cutters 161 and 160 are out of contact with the dies 162 and 162'. In the position of rest of the clinching unit 136 the uppermost end 136a thereof is at a distance from the lower surface of a printed circuit board 12 mounted on the Y frame 132 which is the same as or very slightly greater than the distance by which the stopper ring 166 on the lower portion of the main body portion 145 is separated from the lower surface 164a of the housing 164. In a generally central portion of the main housing portion 145, near to the upper ends of the levers 158 and 159 there is defined an open portion 170 which connects to a pipe 171 via which clipped ends of component leads 2a and 2b may be removed by action of a vacuum-producing means not shown.

Reference is now had to FIG. 30, which shows details of the cutter 161 and fixed die 162 for clipping and clinching the component lead 2b. Cutter 160 and die 162' for clipping and clinching the other lead 2a have an identical construction, but, looking at the clinching unit 136 from the side shown in FIG. 30, the cutter 160 is behind die 162, the die 162' is behind cutter 161, and the 2a lead cutter 160 moves from right to left, i.e., in a direction opposite to that of movement of the 2b lead cutter 161, indicated by the arrow O in drawing. Advance of the cutters 160 and 161 is effected by closing of the upper ends of the levers 158 and 159, this action being described in more detail below.

The cutter 161 has a blunt nose and defines a lower, cutting surface 161a and upper, non-cutting surface 161b. The fixed die 162 defines a flat slightly inclined cutting surface 161a, which the cutter lower surface 161a meets and slides over upon movement of the cutter 161 in the direction of the arrow O, and a side extension 162b, which extends vertically upwards from one edge of the cutting surface 162a and has a top surface 162c. When the clinching unit 136 is raised in a manner described below to an uppermost position, the distance $f$ between the upper surfce 161b of the cutter 161 and the lower surface of the printed circuit board 12 is generally equal to the diameter $d$ of a component lead 2a or 2b, and the upper surface 162c of the die side extension 162b is brought into contact with the lower surface of the printed circuit board 12. The minimum height $e$ of the die side extension 162b is equal to the sum of the distance of $f$ and the thickness $g$ of the cutter 161. Because the clinching unit 136 is always raised to a set height, the die side extension 162 ensures that there is always necessary clearance for the cutter 161 and lead 2b even if the lower surface of the printed circuit board 12 is not perfectly smooth.

Still in FIG. 30, as the cutter 161 is advanced in the direction of the arrow O, first the nose of the cutter 161 pushes the lead 2b into the space defined between the circuit board 12 lower surface and the cutting surface 162a of the die 162. This action simultaneously causes any bent portion of the lead 2b which may be above the upper surface of the printed circuit board 12 to be pulled down. As the cutter 161 further advances the lower, cutting surface 161a thereof meets the cutting surface 162a of the fixed die 162 and the outer end portion 2b' of the lead 2b is clipped off, this end portion 2b' falling into the space 170 and being withdrawn via the pipe 171 (FIG. 29). At the same time the cutter nose and upper surface 161b cause the portion of the lead 2b which is below the lower surface of the printed circuit board 12 to be bent about a point at the junction of the lead insertion hole formed in the circuit board 12 and the lower surface of the circuit board 12, whereby this lower portion of the lead 2b is caused to lie flat against the circuit board 12 lower surface.

As indicated in FIG. 32, identical action, but in opposite directions, is effected by both cutters 160 and 161 moving towards fixed dies 162 and 162', whereby both leads 2a and 2b of a component 3 are clipped then bent against the lower surface of the printed circuit board 12, the leads 2a and 2b of course being bent in opposite directions. The angle which the line of movement h—h of the cutters 160 and 161 forms with the line i—i joining the centres of the leads 2a and 2b is suitably 20° – 90°. This angle is determined by the position of rest of the pinion 147 engaging the spline portion 145 defined at the lower portion of the clinching unit main body portion 145 (FIG. 129).

In FIGS. 30 and 32, if the lower surface of the printed circuit board 12 subsequently receives a coat of plastic, for example, simple bending of the leads 2a and 2b is sufficient to ensure that the component 3 is held on the circuit board 12. In other cases, however it may be preferable to effect further clinching by crossing the leads 2a and 2b over one another. By slight modification of the clinching unit 136 of the apparatus of the invention this is easily effected as follows. According to this modification, lower, cutting surfaces 160a and 161a of the cutters 160 and 161 still meet the cutting surfaces 162a' and 162a of their respective dies 162' and 162, whereby leads 2a and 2b are clipped as described above, but when the clinching unit 136 has been raised to bring the upper surfaces 162c and 162c' of the side extensions 162b and 162b' of the fixed dies 162 and 162', the distance f separating the upper surfaces 160b and 161b of the cutters 160 and 161 is somewhat greater than the diameter of a lead 2a or 2b, the minimum height e' of die side extensions 162b and 162b still being equal to the sum of the distance f and cutter thickness g, and cutter thickness g being suitably slightly greater than lead diameter d, whereby leads 2a and 2b are bent as well as clipped by the cutters 160 and 161, but are not caused to lie flat against the lower surface of the printed circuit board 12. After the leads 2a and 2b are thus bent, the main body portion 145 of the clinching unit 136 is rotated, counterclockwise as seen in FIG. 32, through an angle greater than 180°, during which rotation the die side extensions 162b' and 162b press the leads 2a and 2b and cause the leads 2a and 2b to cross, one lead sliding over the other, after which the main body portion 145 is lowered and rotated back to its original angular position.

If cutter thickness g is made suitably greater than lead diameter d, the same lead crossing action can of course be effected with dies 162 and 162' having side extensions 162b and 162b' with a minimum height e as initially described by screwing the housing 164 (FIG. 29) downwards so that when the clinching unit 136 is raised to an uppermost position the side extension upper surfaces 162c and 162c' do not actually contact the lower surface of the printed circuit board 12 but are separated from the circuit board 12 lower surface by a distance which does not exceed one half the lead diameter d, and then effecting the abovedescribed rotation.

In FIGS. 29 and 31(a) to 31(c), actuation of the clinching unit is effected as follows. Prior to lowering of the insertion unit 10 (FIG. 31a), by the action of spring 143 pulling on center rod 142 and center rod 142, reacting through spring 144, pulling on main body portion 145, the clinching unit 136 as a whole is held in a lower position in which the stopper ring 166 mounted on the lower portion of the main body portion 145 is a distance m below the lower surface 164a of the slide support flange element 164.

Simultaneously with lowering of the insertion unit 10 and insertion thereby of component leads 2a and 2b into holes in the printed circuit board 12 (FIG. 31b), a large radius portion of the cam 139, which is currently rotated, presses against the cam roller 141, whereby the center rod 142 is moved upwards, counter to the force of the spring 143.

Pressure transmitted through the spring 144 by the upwardly rising center rod 142 causes the clinching unit main body portion 145 also to be raised. When, however, the main body portion 145 has been raised a distnce m, the stopper ring 166 comes into contact with the flange lower surface 164a, and further upward movement of the main body portion 145 is prevented. By this upward movement of the main body portion 145 the cutters 160 and 161 and fixed dies 162 and 162' provided at the upper end thereof are also moved upwards through the same distance m, whereby the upper surfaces 162c and 162c' of the die side extensions 162b and 162b' are brought into contact with the lower surface of the printed circuit board 12, this being the condition shown in FIG. 31b.

Although further upward movement of the main body portion 145 is prevented, the center rod 142, which may slide in the main body portion 145, is moved upwards a further distance n upon further rotation of the cam 139, whereby the rollers 169 and 169' on the lower ends of the levers 158 and 159 are pushed apart by the conical element 167 mounted on the upper end of the center rod 142, and the levers 158 and 159 are caused to pivot about the pin 157' in a manner to cause the cutters 160 and 161, in cooperation with the fixed dies 162 and 162' to effect the abovedescribed lead clipping and bending action, this being the stage shown in FIG. 31c.

After this, if it is required to effect crossing of the leads 2a and 2b, the cylinder 148 is actuated and, acting through pinion 147 engaging the spline portion 146 defined in the lower end portion of the main body portion 145, causes requisite rotation and subsequent return movement of the main body portion 45.

Whether or not lead crossing is effected, continued rotation of the cam 139 brings a small radius portion thereof into contact with the cam roller 141, whereby the spring 143 is allowed to return the clinching unit 136 to its original position, the insertion unit 10 again being raised in readiness for insertion of a next component 3, as shown in FIG. 31a.

As is clear from the above description, the present invention offers various advantages, principal advantages being as follows.

1. In all stages components to be mounted are held and the attitude thereof is controlled, and there is therefore no risk of components being damaged due to impact against other components or parts of the mounting appratus, or of components being out of correct alignment when leads thereof are inserted into a printed circuit board.

2. The mounting apparatus is greatly simplified since selection of different components requires movement of only a single selection block, and only one cut-off means and one component substrate advance means are required for all different types of components. Thus the mounting apparatus may be more compact, assembly and maintenance are easier, and control circuit construction is simpler since there are less units whose action is required to be controlled.

3. By employment of a single drive source for the cutter and transfer unit, insertion unit, and clinching unit, synchronization of action of these units is more easily achieved, and action thereof may be speeded in a smooth and uniform manner to reduce insertion cycle time.

4. The provision of a component detection unit at the cut-off station ensures that each component substrate always has a component in position for cut-off and subsequent insertion, whereby there is no risk of one type of component being mounted on a printed circuit board portion requiring another type of component to be mounted thereon.

Referring to FIGS. 33 and 34, there is shown a modification wherein the component substrate advance sprocket wheel 14 of a transport unit 1 is replaced by a wheel 14', which is driven in the same manner as described above in reference to FIGS. 6 through 8, and which defines peripheral V-shaped notches 173 which are formed at intervals of pitch P and engage successive pairs of leads 2a and 2b, whereby the component substrate 6 is advanced in successive steps upon actuation of the wheel 14'. Alternatively the periphery of the wheel 14' may define successive pairs of notches 173, the notches 173 in each pair being separated by a distance equal to the spacing p between each pair of leads 2a and 2b, and each pair of notches 173 being separated by a distance equal to the distance P separating successive pairs of leads 2a and 2b, in which case each lead of a component is engaged by a notch 173 to cause advance of the component substrate 6. In either modification, formation of holes 6a in component substrates 6 is of course unnecessary.

What is claimed is:

1. Component mounting apparatus comprising
a plurality of stands for accommodating a plurality of component substrates in ribbon-like form and carrying different components having leads attached to and extending therefrom, end portions of the leads of said components being attached to said component substrates;
a plurality of transport units provided in alignment with said stands, and having attached thereto leading ends of said component substrates and including means for individually advancing said component substrates and bringing successive components carried by said component substrates into leading positions on said component substrates and to a cut-off line;
a component selection block laterally movable for bringing a selected component substrate carrying a component required to be mounted into line with a cut-off station;
a cutter and transfer unit at said cut-off station, for cutting said leads of said leading component of said selected component substrate, thereby detaching said component from said component substrate, and for transporting said detached component to a transfer station and subsequently releasing said component;
printed circuit board positioning means for supporting a printed circuit board and moving said printed circuit board for bringing successive portions of said printed circuit board requiring successive said components to be mounted thereon to an insertion station;
an insertion unit for receiving and holding a component brought to said transfer station by said cutter and transfer unit, said cutter and transfer unit releasing said component when said component is held by said insertion unit, and for moving said received component toward and guiding said leads of said component into a printed circuit board portion at said insertion station.

2. Component mounting apparatus comprising
a plurality of stands for accommodating a plurality of component substrates in ribbon-like form and carrying different components having leads attached to and extending therefrom, end portions of the leads of said components being attached to said component substrates and said component substrates being freely and independently feedable from said stands;
a plurality of transport units equal in number to and provided in alignment with and forward of said stands, and having attached thereto leading ends of said component substrates;
transport unit actuation means for individually advancing said component substrates in uniform steps and bringing successive components carried by said component substrates into leading positions on said component substrates and to a cut-off line whereat said outer end portions of the leads of said leading components are to be cut to effect detachment of said components from said component substrates;
a component selection block having said stands and said transport units mounted thereon and laterally movable for bringing a selected component substrate carrying a component required to be mounted into line with a cut-off station and a leading component carried by said component substrate into line with said cut-off station;
a cutter and transfer unit which is movable to said cut-off station, and when at said cut-off station, for cutting said leads of said leading component of said selected component substrate, thereby detaching said component from said component substrate, and simultaneously for providing support to said detached component, and for transporting said detached component to a transfer station and subsequently releasing said component;
printed circuit board positioning means for supporting a printed circuit board in a horizontal alignment and for moving said printed circuit board for bringing successive portions of said printed circuit board requiring successive said components to be mounted thereon to an insertion station;
an insertion unit which is movable to said transfer station, and for receiving and holding a component brought to said transfer station by said cutter and transfer unit, said cutter and transfer unit releasing said component when said component is held by said insertion unit, and for moving said received component vertically downwards towards and guiding said leads of said component into a printed circuit board portion brought to said insertion station.

3. Component mounting apparatus as claimed in claim 2, which further comprises a clinching unit which is positioned below said printed circuit board and in vertical alignment with said insertion station, for clipping said leads of a component inserted into said printing circuit board, and bending said leads to bring the outer ends thereof generally parallel with the lower surface of said printed circuit board.

4. Component mounting apparatus as claimed in claim 2, wherein said clinching unit comprises a plurality of cutting means, one for each lead of a component, and each having a movable cutter with a lower cutting surface and an upper non-cutting surface and a fixed die with a cutting surface over which said cutter lower surface is slidable, said cutter and said die normally being separate and held in first, lower positions, means for raising said cutter and die together to second, higher positions on opposite sides of an inserted lead, and means for moving said cutter over said die upper surface for simultaneously clipping and bending a lead.

5. Component mounting apparatus as claimed in claim 4, wherein the line of advance of each said cutter to each said die is at an angle in the range 20° to 90° with respect to the line joining the centers of a pair of inserted component leads.

6. Component mounting apparatus as claimed in claim 4, wherein each said die has an upward side extension which when said die is at said second position contacts and supports a portion of said printed circuit board.

7. Component mounting apparatus as claimed in claim 4, wherein said clinching unit further comprises means for crossing of said outer ends of said leads.

8. Component mounting apparatus as claimed in claim 2, wherein said cutter and transfer unit comprises a cut-off and holder section comprising a pair of openable and closable jaw elements each of which has a flat portion which is generally parallel to and separated by a distance approximating the diameter of said component leads from the flat portion of the other when said jaw elements are closed, one jaw element having a concave cutter portion with a width greater than the distance separating said leads of each said component attached to said component substrates, and the other jaw element having an extending blade portion which has an outer profile larger than the internal profile of said cutter portion, and such that it can at least partially enter said concave cutter portion, whereby said blade spreads said leads of a component and said leads can be cut by said blade and said cutter portion after entry of a certain amount of said blade into said concave cutter portion and after spreading of said leads to a certain distance, said cutter portion and said blade being nearer than said flat portions to said selected component substrate when said cutter and transfer unit is at said cut-off station, whereby said leads are cut by said blade and said cutter portion subsequent to spreading thereof to a set distance and are simultaneously held by said flat portions of said jaws.

9. Component mounting apparatus as claimed in claim 2, which further includes a clinching unit provided below said printed circuit board vertically in line with said insertion unit and actuable for clipping the outer ends of said component leads inserted into said printed circuit board and for bending at least the outer end portions of said leads to a general flat relationship to the lower surface of said printed circuit board.

10. Component mounting apparatus as claimed in claim 9, wherein said clinching unit further comprises means for crossing said leads.

11. Component mounting apparatus as claimed in claim 2, which further includes a detection unit for detecting the presence of a component at said cut-off station and for emitting output signals indicative of the presence and absence of a component at said cut-off station.

12. Component mounting apparatus as claimed in claim 11, wherein said transport unit actuation means is coupled to said detection unit for being actuated in response to output signals of said detection unit.

13. Component mounting apparatus as claimed in claim 11, wherein said detection unit includes a photoemissive diode positioned above and directing light onto said cut-off station, a photosensitive diode positioned near to said photoemissive diode, and a reflecting mirror positioned below said cut-off station for receiving light emitted by said photoemissive diode and directing said light to said photosensitive diode.

14. Component mounting apparatus as claimed in claim 2, wherein each said component substrate has regularly spaced engagement portions, each said transport unit comprises an engagement wheel means for successively engaging said engagement portions of a component substrate attached thereto, a drive wheel means fixedly mounted on a rotatory shaft supported by said transport unit, timing chain means connecting said drive wheel means and said engagement wheel means, ratchet wheel means fixedly mounted on said rotatory shaft, a lever means which is rotatably mounted on said rotatory shaft and having mounted a first end thereof a pawl means normally urged into engagement with said ratchet wheel means, and having the opposite end contactable by said transport unit actuation means, and spring means exerting a force for bringing said lever means to a position wherein said pawl means engages said ratchet wheel means without exerting turning pressure thereon, and wherein said transport unit actuation means is comprised of a pusher means for pushing said opposite end of said lever means and causing said lever means to pivot in a direction in which said pawl means advances said ratchet wheel means.

* * * * *